(12) United States Patent
Ohmaru et al.

(10) Patent No.: US 8,988,152 B2
(45) Date of Patent: Mar. 24, 2015

(54) SEMICONDUCTOR DEVICE

(71) Applicant: Semiconductor Energy Laboratory Co., Ltd., Atsugi-shi, Kanagawa-ken (JP)

(72) Inventors: Takuro Ohmaru, Kanagawa (JP); Shuhei Nagatsuka, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 87 days.

(21) Appl. No.: 13/768,743

(22) Filed: Feb. 15, 2013

(65) Prior Publication Data

US 2013/0221344 A1 Aug. 29, 2013

(30) Foreign Application Priority Data

Feb. 29, 2012 (JP) ................................ 2012-044279

(51) Int. Cl.
*H03K 3/03* (2006.01)
*H01L 29/786* (2006.01)
*H01L 27/088* (2006.01)
*H01L 27/12* (2006.01)

(52) U.S. Cl.
CPC ............ *H01L 29/786* (2013.01); *H01L 27/088* (2013.01); *H01L 27/1225* (2013.01)
USPC ................................ 331/57; 326/36; 326/119

(58) Field of Classification Search
CPC . H03K 3/0315; H03K 19/0013; H03K 19/20; H03K 2005/00032; H03K 2005/00195; H03K 2217/0018

USPC .................... 331/57; 326/35, 36, 95–98, 119
See application file for complete search history.

(56) References Cited

U.S. PATENT DOCUMENTS

| 5,731,856 | A | 3/1998 | Kim et al. |
| 5,744,864 | A | 4/1998 | Cillessen et al. |
| 6,294,274 | B1 | 9/2001 | Kawazoe et al. |

(Continued)

FOREIGN PATENT DOCUMENTS

| EP | 1 737 044 A1 | 12/2006 |
| EP | 2 226 847 A2 | 9/2010 |

(Continued)

OTHER PUBLICATIONS

Whitaker, "Microelectronics: Second Edition", Chapter 6: Integrated Circuit Design, Published 2006 by CRC Press, ISBN: 978-0-8493-3391-0, pp. 6-1-6-24.*

(Continued)

*Primary Examiner* — Ryan Johnson
(74) *Attorney, Agent, or Firm* — Fish & Richardson P.C.

(57) ABSTRACT

To provide a semiconductor device including an inverter circuit whose driving frequency is increased by control of the threshold voltage of a transistor or a semiconductor device including an inveter circuit with low power consumption. An inverter circuit includes a first transistor and a second transistor each including a semiconductor film in which a channel is formed, a pair of gate electrodes between which the semiconductor film is placed, and source and drain electrodes in contact with the semiconductor film. Controlling potentials applied to the pair of gate electrodes makes the first transistor have normally-on characteristics and the second transistor have normally-off characteristics. Thus, the driving frequency of the inverter circuit is increased.

18 Claims, 19 Drawing Sheets

(56) References Cited

U.S. PATENT DOCUMENTS

| | | | |
|---|---|---|---|
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,230,601 B2 | 6/2007 | Yamazaki et al. | |
| 7,245,151 B2* | 7/2007 | Baude et al. | 326/62 |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,385,436 B2* | 6/2008 | Itoh et al. | 327/534 |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,791,072 B2 | 9/2010 | Kumomi et al. | |
| 7,821,035 B2* | 10/2010 | Nomura et al. | 257/194 |
| 7,940,085 B2* | 5/2011 | Kim et al. | 326/83 |
| 8,067,775 B2 | 11/2011 | Miyairi et al. | |
| 8,237,166 B2 | 8/2012 | Kumomi et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0164153 A1* | 7/2006 | Yamashida | 327/534 |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0085081 A1* | 4/2010 | Ofuji et al. | 326/102 |
| 2010/0092800 A1 | 4/2010 | Itagaki et al. | |
| 2010/0109002 A1 | 5/2010 | Itagaki et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| WO | 2004/114391 A1 | 12/2004 |

OTHER PUBLICATIONS

Y. Saito et al.; "Spin-based MOSFET and Its Applications"; ECS Transactions; Jun. 26, 2011; pp. 217-228; vol. 37, No. 1.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

(56) References Cited

OTHER PUBLICATIONS

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID, 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG—Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N. et al., "Spinel,YbFe2O4, and Yb2Fe3O7 Types of Structures for Compounds in the In2O3 and Sc2O3—A2O3-BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits, 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem Oleds," SID Digest '09 : SID International Symposium Digest of Technical Papers, May 31, 2009, vol. 40, pp. 899-902.

(56) References Cited

OTHER PUBLICATIONS

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner 400 401

402

403

404

405

SEMICONDUCTOR DEVICE

BACKGROUND OF THE INVENTION

1. Field of the Invention

The present invention relates to a semiconductor device including a logic circuit.

2. Description of the Related Art

Techniques for fabricating transistors with the use of a semiconductor thin film formed over a substrate having an insulating surface have advanced in recent years, and such transistors are widely used in electronic devices such as integrated circuits (ICs) and image display devices (display devices).

As a semiconductor material that can be applied to transistors, silicon is widely known. As other materials, oxide semiconductors such as indium oxide and zinc oxide and III-V compound semiconductors such as gallium arsenide have attracted attention.

For example, Patent Document 1 discloses a transistor using an amorphous oxide semiconductor containing indium (In), gallium (Ga), and zinc (Zn).

Note that transistors formed using the above oxide semiconductor are n-channel transistors. As a result, logic circuits formed using the transistors are logic circuits in which all the transistors have the same conductivity type.

REFERENCE

Patent Document 1: Japanese Published Patent Application No. 2006-165528

SUMMARY OF THE INVENTION

In the case where an inverter circuit is formed as a logic circuit in which all transistors have the same conductivity type, the threshold voltages of the transistors in the inverter circuit need to be controlled individually. For example, the inverter circuit operates with one of the transistors serving as a current source and the other transistor serving as a switch, for example.

In the inverter circuit in which all the transistors have the same conductivity type, the driving frequency is lowered because the rise time of an output signal of the inverter circuit becomes longer when one of the transistors is turned on. Moreover, power consumption is increased because of the off-state leakage current of one or the other of the transistors.

In view of the foregoing problems, objects are to provide a semiconductor device including a logic circuit with high driving frequency and to provide a semiconductor device including a logic circuit with low power consumption. One embodiment of the present invention is to achieve one of the above objects.

In one embodiment of the present invention, a logic circuit is configured using a transistor including a semiconductor film in which a channel is formed, a pair of gate electrodes provided so that the semiconductor film is placed therebetween, and a source electrode and a drain electrode provided in contact with the semiconductor film. In the transistor, one of the pair of gate electrodes overlaps the semiconductor film with a first gate insulating film placed therebetween, and the other of the pair of gate electrodes overlaps the semiconductor film with a second gate insulating film placed therebetween. Here, one of the pair of gate electrodes is referred to as a first gate electrode, and the other thereof is referred to as a second gate electrode.

In the case where an inverter circuit is configured as the logic circuit, for example, a first transistor and a second transistor are connected in series between a first power supply line supplied with a power supply potential and a second power supply line supplied with a ground potential. That is, a source electrode of the first transistor and a drain electrode of the second transistor are electrically connected to each other. In this case, one of a pair of gate electrodes of the first transistor is connected to a third power supply line, the other of the pair of gate electrodes of the first transistor is connected to a fourth power supply line, and the source electrode of the first transistor is connected to the drain electrode of the second transistor and an output terminal of the inverter circuit. One of a pair of gate electrodes of the second transistor is connected to an input terminal of the inverter circuit, and the other of the pair of gate electrodes of the second transistor is connected to a fifth power supply line.

The first and second transistors have the other of the pair of gate electrodes (the second gate electrode) so that the threshold voltages of the first and second transistors are controlled individually, whereby the first transistor can have normally-on characteristics and the second transistor can have normally-off characteristics.

The normally-on characteristics of the first transistor can increase the current drive capability of the first transistor. As a result, the rise time of the output signal of the inverter circuit can be shortened as compared to the case where the first transistor does not have the other of the pair of gate electrodes (the second gate electrode). Thus, the driving frequency of the inverter circuit can be increased. In addition, the normally-off characteristics of the second transistor can reduce the off-state leakage current of the second transistor, leading to reduction in power consumption.

A ring oscillator can be configured in such a manner that an odd number of the above-described inverter circuits (also referred to as first inverter circuits) are connected in series and the output terminal of the last-stage inverter circuit is connected to the input terminal of the first-stage inverter circuit.

The driving frequency of the first inverter circuit is high because the rise time of the output signal is short. For this reason, configuring a ring oscillator by using an odd number of the first inverter circuits can increase the oscillation frequency of the ring oscillator. Moreover, with high oscillation frequency, the delay time of each first inverter circuit can be shortened and the ring oscillator can operate at high speed.

The ring oscillator may also include a control inverter circuit (also referred to as second inverter circuit) in order to control a potential applied to the other of the pair of gate electrodes of the first transistor included in the first inverter circuit.

An input terminal of the second inverter circuit is supplied with the same input signal as the first inverter circuit. An output terminal of the second inverter circuit is connected to the other of the pair of gate electrodes of the first transistor included in the first inverter circuit. As a result, an inverted signal of the input signal is input to the other of the pair of gate electrodes of the first transistor.

In the second inverter circuit, for example, a third transistor and a fourth transistor are connected in series between a sixth power supply line supplied with a power supply potential and a seventh power supply line supplied with a ground potential. In this case, one of a pair of gate electrodes of the third transistor is connected to an eighth power supply line, the other of the pair of gate electrodes of the third transistor is connected to a ninth power supply line, and a source electrode of the third transistor is connected to a drain electrode of the fourth transistor and an output terminal of the second inverter circuit. Moreover, one of a pair of gate electrodes of the fourth transistor is connected to an input terminal of the second inverter circuit, and the other of the pair of gate electrodes of the fourth transistor is connected to a tenth power supply line.

In the second inverter circuit, the third and fourth transistors have the other of the pair of gate electrodes (the second gate electrode) so that the threshold voltages of the third and fourth transistors are controlled individually, whereby the third transistor can have normally-on characteristics and the fourth transistor can have normally-off characteristics.

Further, in the first inverter circuit, the first and second transistors have the other of the pair of gate electrodes (the second gate electrode) so that the threshold voltages of the first and second transistors are controlled individually, whereby the first transistor can have normally-on characteristics or normally-off characteristics and the second transistor can have normally-off characteristics.

The normally-on characteristics of the third transistor can increase the current drive capability of the third transistor. As a result, the rise time of the output signal of the second inverter circuit can be shortened as compared to the case where the third transistor does not have the other of the pair of gate electrodes (the second gate electrode). Thus, the driving frequency of the second inverter circuit can be increased. In addition, the normally-off characteristics of the fourth transistor can reduce the off-state leakage current of the fourth transistor, leading to reduction in power consumption.

In addition, whether the first transistor has normally-on characteristics or normally-off characteristics can be controlled by the output signal of the second inverter circuit. Consequently, the rise time of the output signal of the first inverter circuit can be shortened as compared to the case where the first transistor does not have the other of the pair of gate electrodes (the second gate electrode). Thus, the driving frequency of the first inverter circuit can be increased. Moreover, the normally-off characteristics of the first transistor can suppress the shoot-through current, so that the amplitude of the output signal can be enhanced.

A ring oscillator can be composed of an odd number of the first inverter circuits. To configure a ring oscillator, an odd number of the first inverter circuits are connected in series, and the output terminal of the last-stage inverter circuit is connected to the input terminal of the first-stage inverter circuit. The ring oscillator includes the same number of the second inverter circuits as the first inverter circuits. The input terminal of each of the first inverter circuits is connected to the input terminal of the corresponding second inverter circuit, and the output terminal of each of the second inverter circuit is connected to the other of the pair of gate electrodes of the first transistor included in the corresponding first inverter circuit.

The output terminal of the second inverter circuit is connected to the other of the pair of gate electrodes (the second gate electrode) of the first transistor in the first inverter circuit, whereby whether the first transistor has normally-on characteristics or normally-off characteristics can be controlled by the output signal of the second inverter circuit. Consequently, the rise time of the output signal of the first inverter circuit can be shortened as compared to the case where the first transistor does not have the other of the pair of gate electrodes (the second gate electrode). Thus, the driving frequency of the first inverter circuit can be increased. For this reason, configuring a ring oscillator by using the first inverter circuit can increase the oscillation frequency of the ring oscillator. Moreover, with high oscillation frequency, the delay time of each first inverter circuit can be shortened and the ring oscillator can operate at high speed. In addition, the normally-off characteristics of the first transistor can suppress the shoot-through current, so that the first inverter circuit can enhance the amplitude of the output signal. Thus, the gain of the ring oscillator can be increased, thereby extending the operating range of the ring oscillator.

The following configuration may be employed in order to input an inverted signal to the other of the pair of gate electrodes (the second gate electrode) of the first transistor in the inverter circuit without using a control inverter circuit.

Among an odd number of the inverter circuits, the output terminal of one inverter circuit is connected to the input terminal of the next inverter circuit and the other of the pair of gate electrodes of the first transistor in the inverter circuit after the next inverter circuit. Further, the output terminal of the last-stage inverter circuit is connected to the input terminal of the first-stage inverter circuit. Note that the other of the pair of gate electrodes of the first transistor in the first-stage inverter circuit may be supplied with an inverted signal generated by another circuit or may be connected to the output terminal of the inverter circuit before the last-stage inverter circuit.

In the first inverter circuit, the ratio (W/L) of channel width W to channel length L of the first transistor is preferably lower than that of the second transistor. In the second inverter circuit, the ratio (W/L) of channel width W to channel length L of the third transistor is preferably lower than that of the fourth transistor.

Any of the above ring oscillators can be used as a voltage controlled oscillator included in a phase locked loop.

A semiconductor film used in the first to fourth transistors can be, for example, an In—Ga—Zn-based oxide semiconductor film. As the semiconductor film used in the first to fourth transistors, a film of a compound semiconductor such as gallium nitride, gallium arsenide, or indium gallium arsenide can also be used instead of the oxide semiconductor film.

According to one embodiment of the present invention, it is possible to provide a semiconductor device including a logic circuit whose driving frequency is increased by control of the threshold voltage of a transistor. In addition, it is possible to provide a semiconductor device including a logic circuit with low power consumption.

DETAILED DESCRIPTION OF THE INVENTION

Figure 1A:
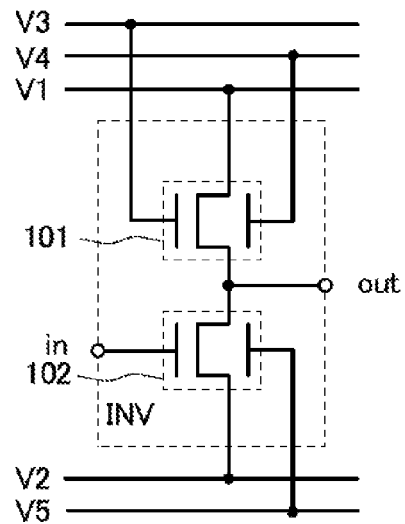
FIGS. 1A to 1C illustrate a logic circuit and a semiconductor device according to one embodiment of the present invention.

Examples of embodiments of the present invention will be described in detail with reference to the accompanying drawings. Note that the present invention is not limited to the following description, and it is easily understood by those skilled in the art that the mode and details can be variously changed without departing from the spirit and scope of the present invention. Therefore, the present invention should not be construed as being limited to the description of the embodiments below. In the structures to be given below, the same portions or portions having similar functions are denoted by the same reference numerals in different drawings, and explanation thereof will not be repeated in some cases.

Note that the position, size, range, or the like of each component illustrated in the drawings and the like is not accurately represented in some cases for easy understanding. Therefore, one embodiment of the present invention is not necessarily limited to the position, size, range, or the like disclosed in the drawings and the like.

In this specification and the like, ordinal numbers such as first, second, and third are used in order to avoid confusion among components, and the terms do not mean limitation of the number of components.

In this specification and the like, "voltage" and "potential" are used in the same meaning in some cases.

Functions of a source and a drain are sometimes replaced with each other when a transistor of opposite polarity is used or when the direction of current flowing is changed in circuit operation, for example. Therefore, the terms "source" and "drain" can be used to denote the drain and the source, respectively, in this specification.

Note that in this specification and the like, the term "electrically connected" includes the case where components are connected through an object having any electric function. There is no particular limitation on an object having any electric function as long as electric signals can be transmitted and received between components that are connected through the object.

In this specification and the like, when a transistor is on (in an on state), a potential applied to a first gate electrode of the transistor is higher than or equal to the threshold voltage of the transistor. When the transistor is off (in an off state), a potential applied to the first gate electrode of the transistor is lower than the threshold voltage of the transistor. For example, a transistor having "normally-on" characteristics is on when a potential applied to a first gate electrode of the transistor is 0V. That is, a normally-on transistor is a transistor whose threshold voltage is 0 V or lower. In addition, a transistor having "normally-off" characteristics is off when a potential applied to a first gate electrode of the transistor is 0 V. That is, a normally-off transistor is a transistor whose threshold voltage is higher than 0 V.

(Embodiment 1)

In this embodiment, a ring oscillator according to one embodiment of the present invention will be described with reference to FIGS. 1A to 1C and FIGS. 2A to 2C. A ring oscillator illustrated in FIGS. 1B and 1C includes an inverter circuit INV illustrated in FIG. 1A as an inverter circuit; therefore, the inverter circuit INV illustrated in FIG. 1A will be described first.

FIG. 1A is a circuit diagram illustrating a specific configuration of the inverter circuit INV. The inverter circuit INV includes a transistor 101 and a transistor 102. In the inverter circuit INV, the transistor 101 and the transistor 102 are connected in series between a power supply line V1 supplied with a power supply potential V1 and a power supply line V2 supplied with a power supply potential V2. In other words, a source electrode of the transistor 101 and a drain electrode of the transistor 102 are electrically connected to each other.

The transistor 101 and the transistor 102 are transistors of the same conductivity type; therefore, the transistors 101 and 102 may be n-channel transistors or p-channel transistors as long as they have the same conductivity type. In the case where the transistors 101 and 102 are n-channel transistors, the power supply potential V1 is made higher than the power supply potential V2. The power supply potential V2 is, for example, a ground potential or a negative potential. That is, the power supply potential V1 is a high power supply potential and the power supply potential V2 is a low power supply potential. On the other hand, in the case where the transistors 101 and 102 are p-channel transistors, the power supply potential V1 is made lower than the power supply potential V2. The power supply potential V1 is, for example, a ground potential or a negative potential. That is, the power supply potential V1 is a low power supply potential and the power supply potential V2 is a high power supply potential.

Each of the transistors 101 and 102 includes a semiconductor film in which a channel is formed, a pair of gate electrodes provided so that the semiconductor film is placed therebetween, and a source electrode and a drain electrode provided in contact with the semiconductor film. In each of the transistors, one of the pair of gate electrodes overlaps the semiconductor film with a first gate insulating film placed therebetween, and the other of the pair of gate electrodes overlaps the semiconductor film with a second gate insulating film placed therebetween. Here, one of the pair of gate electrodes is referred to as a first gate electrode, and the other thereof is referred to as a second gate electrode (or a back-gate).

For the semiconductor films of the transistors 101 and 102, an oxide semiconductor or a compound semiconductor such as gallium nitride, gallium arsenide, indium arsenide, or indium gallium arsenide can be used.

This embodiment explains the case where an oxide semiconductor film is used as the semiconductor film. In the oxide semiconductor film, a region in which a channel is formed is preferably a region that is highly purified by reduction in impurities and reduction in oxygen vacancies. The highly purified oxide semiconductor (purified OS) is an intrinsic (i-type) semiconductor or a substantially i-type semiconductor. For this reason, a transistor using the above oxide semiconductor for a channel formation region has extremely low off-state current, and its threshold voltage is unlikely to shift in the negative direction (i.e., the transistor easily obtains normally-off characteristics).

In the inverter circuit INV, the first gate electrode of the transistor 101 is connected to a power supply line V3 supplied with a power supply potential V3. A drain electrode of the transistor 101 is connected to the power supply line V1 supplied with the power supply potential V1. The second gate electrode of the transistor 101 is connected to a power supply line V4 supplied with a power supply potential V4. The source electrode of the transistor 101 is connected to the drain electrode of the transistor 102 and an output terminal (out). The first gate electrode of the transistor 102 is connected to an input terminal (in) to which an input signal is input. A source electrode of the transistor 102 is connected to the power supply line V2 supplied with the power supply potential V2. The second gate electrode of the transistor 102 is connected to a power supply line V5 supplied with a power supply potential V5.

Although not illustrated, the power supply line V3 is connected to a first potential generator circuit that generates the power supply potential V3, the power supply line V4 is connected to a second potential generator circuit that generates the power supply potential V4, and the power supply line V5 is connected to a third potential generator circuit that generates the power supply potential V5. Each of the first to third potential generator circuits can generate a plurality of potentials.

Next, the operation of the inverter circuit INV illustrated in FIG. 1A will be described. Here, the operation of the inverter circuit INV in which the transistors 101 and 102 are n-channel transistors is described.

In the inverter circuit INV, the transistor 101 functions as a current source and the transistor 102 functions as a switch. In other words, an inverted signal is output from the output terminal (out) of the inverter circuit INV by turning on or off the transistor 102. Thus, the inverter circuit does not work if the current drive capability of the transistor 102 is lower than that of the transistor 101.

In the inverter circuit INV, the power supply potential V5 is made substantially the same as or lower than the power supply potential V2, whereby the threshold voltage of the transistor 102 shifts in the positive direction and the transistor 102 thus has normally-off characteristics.

Further, one of the power supply potential V3 and the power supply potential V4 is made substantially the same as or higher than the power supply potential V1 and the other thereof is made positive, whereby the threshold voltage of the transistor 101 shifts in the negative direction and the transistor 101 thus has normally-on characteristics.

When a low-level potential (e.g., VSS) is input to the input terminal (in) as an input signal in the above-described state, the transistor 102 is turned off. Since the transistor 101 is on, a high-level potential (e.g., VDD) is output from the output terminal (out) as an inverted signal.

On the other hand, when the high-level potential is input to the input terminal (in) as the input signal, the transistor 102 is turned on. At this time, although the transistor 101 is on, the current drive capability of the transistor 102 is higher than that of the transistor 101; thus, a larger amount of current flows through the transistor 102 than through the transistor 101. Consequently, the low-level potential is output from the output terminal (out) as the inverted signal.

As illustrated in FIG. 1A, the second gate electrodes are provided in the transistors 101 and 102 to control the threshold voltages of the transistors 101 and 102 individually, whereby the transistor 101 can have normally-on characteristics and the transistor 102 can have normally-off characteristics.

The normally-on characteristics of the transistor 101 can increase the current drive capability of the transistor 101. As a result, the rise time of the output signal of the inverter circuit INV can be shortened as compared to the case where the transistor 101 does not have the second gate electrode. Thus, the driving frequency of the inverter circuit INV can be increased. In addition, the normally-off characteristics of the transistor 102 can reduce the off-state leakage current of the transistor 102, leading to reduction in power consumption of the inverter circuit INV.

In the inverter circuit INV illustrated in FIG. 1A, the size of the transistor 101 is preferably smaller than that of the transistor 102 because the transistor 101 needs to have a lower current drive capability than the transistor 102. That is, the channel width (W) (or the ratio (W/L) of channel width (W) to channel length (L)) of the transistor 101 is preferably smaller than that of the transistor 102.

Next, a ring oscillator including the inverter circuit INV illustrated in FIG. 1A will be described with reference to FIGS. 1B and 1C.

Figure 1B:
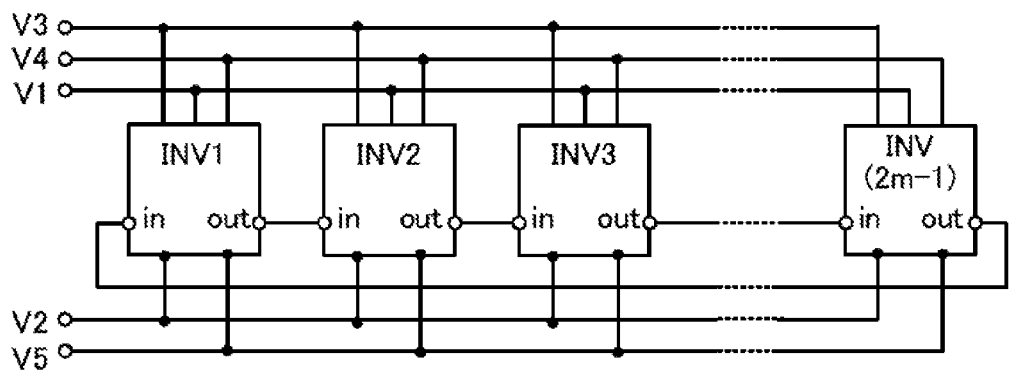

The ring oscillator illustrated in FIG. 1B self-oscillates in such a manner that an odd number of the inverter circuits INV illustrated in FIG. 1A are connected in series and an output from the output terminal (out) of the last inverter circuit INV(2m−1)(m>0) is fed back to the input terminal (in) of the first inverter circuit INV1. FIG. 1C specifically illustrates the first to three inverter circuits (INV) in the ring oscillator illustrated in FIG. 1B.

In the ring oscillator in FIG. 1B, the power supply line V1 is connected to the drain electrode of the transistor 101 in each inverter circuit INV, the power supply line V2 is connected to the source electrode of the transistor 102 in each inverter circuit INV, the power supply line V3 is connected to the first gate electrode of the transistor 101 in each inverter circuit INV, the power supply line V4 is connected to the second gate electrode of the transistor 101 in each inverter circuit INV, and the power supply line V5 is connected to the second gate electrode of the transistor 102 in each inverter circuit INV.

The driving frequency of the inverter circuit INV illustrated in FIG. 1A is high because the rise time of the output signal is short. For this reason, configuring the ring oscillator in FIG. 1B by using the inverter circuits INV can increase the oscillation frequency of the ring oscillator. Moreover, with high oscillation frequency, the delay time of each inverter circuit INV can be shortened and the ring oscillator can operate at high speed.

Alternatively, in the inverter circuit INV, the transistor 101 may have normally-off characteristics in such a manner that the power supply potential V3 is made substantially the same as the power supply potential V1 and the power supply potential V4 is made lower than the power supply potential V2 so that the threshold voltage of the transistor 101 shifts in the positive direction. The normally-off characteristics of the transistor 101 can reduce leakage current of the transistor 101, which leads to further reduction in power consumption of the inverter circuit INV and reduction in power consumption of the ring oscillator including the inverter circuit INV.

Changing the power supply potential V4, which is applied to the second gate electrode of the transistor 101, in the above manner can control increase in the driving frequency due to high-speed operation of the inverter circuit INV or reduction in power consumption due to low-speed driving. Accordingly, the transistor 101 preferably has normally-on characteristics when the inverter circuit INV is driven at high speed, whereas the transistor 101 preferably has normally-off characteristics when the inverter circuit INV is driven at low speed. The power supply potential V4 can be controlled by the second potential generator circuit.

Figure 1C:
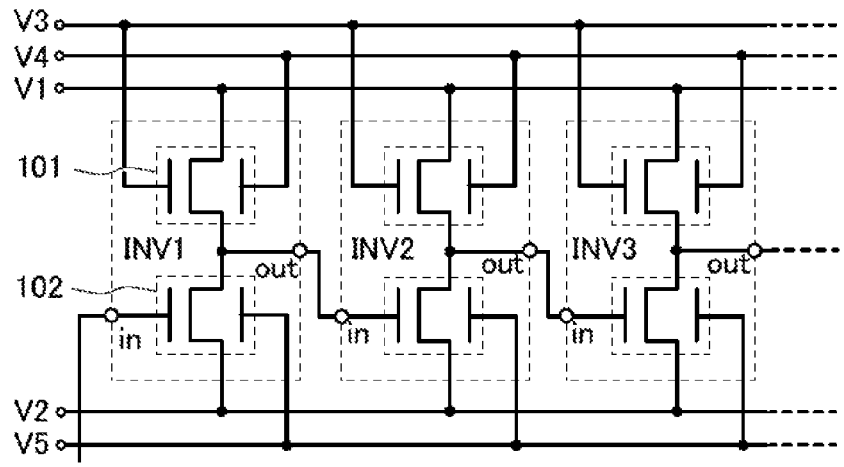
Figure 2A:
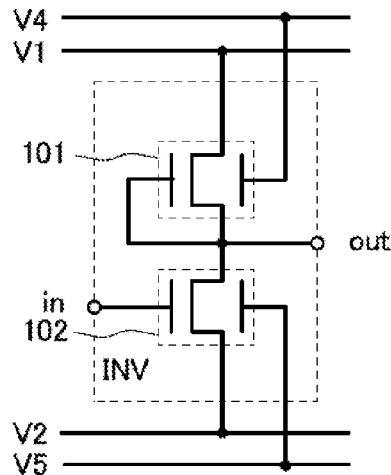
FIGS. 2A to 2C illustrate a logic circuit and a semiconductor device according to one embodiment of the present invention.
Figure 2B:
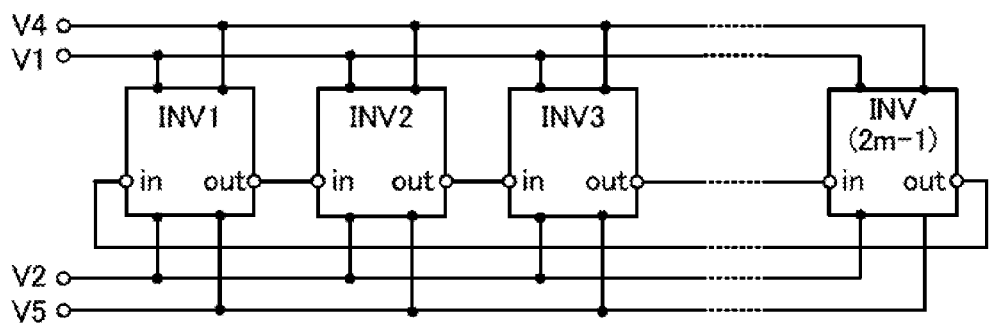
Figure 2C:
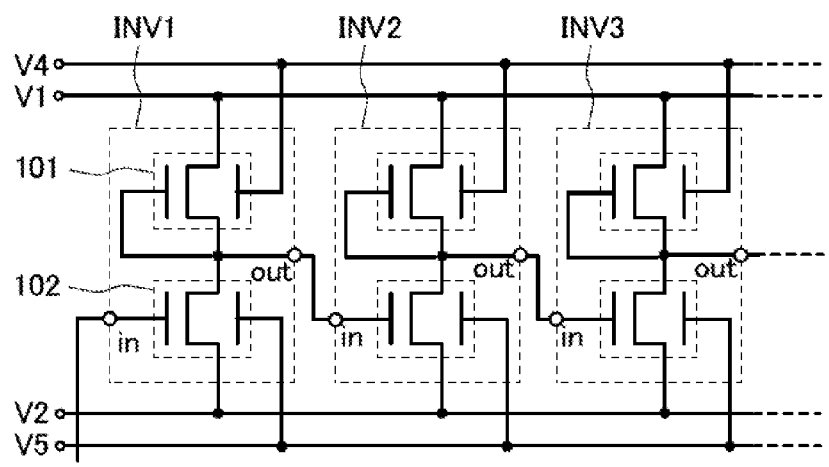

FIGS. 2A to 2C illustrate the inverter circuit INV and a ring oscillator that are partly different from those in FIGS. 1A to 1C.

In the inverter circuit INV illustrated in FIG. 2A, the drain electrode of the transistor 101 is connected to the power supply line V1 supplied with the power supply potential V1. The second gate electrode of the transistor 101 is connected to the power supply line V4 supplied with the power supply potential V4. The first gate electrode of the transistor 101 is connected to the source electrode of the transistor 101 and the output terminal (out). Thus, the voltage between the first gate electrode and the source electrode of the transistor 101 is 0 V, so that the transistor 101 is off.

However, the transistor 101 can have normally-on characteristics by making the power supply potential V4 positive so that the threshold voltage of the transistor 101 shifts in the negative direction.

The normally-on characteristics of the transistor 101 can increase the current drive capability of the transistor 101. As a result, the rise time of the output signal of the inverter circuit INV can be shortened as compared to the case where the transistor 101 does not have the second gate electrode. Thus, the driving frequency of the inverter circuit INV can be increased. Further, since the power supply line V3 is not necessarily used, the number of power supply lines can be decreased as compared to the configuration in FIG. 1A.

In the inverter circuit INV illustrated in FIG. 2A, the first gate electrode and the source electrode of the transistor 101 are connected to each other (i.e., the transistor 101 is not diode-connected); thus, the current drive capability of the transistor 101 is extremely low. Therefore, the size of the transistor 101 is preferably larger than that of the transistor 102. That is, the channel width (W) (or the ratio (W/L) of channel width (W) to channel length (L)) of the transistor 101 is preferably larger than that of the transistor 102.

A ring oscillator including the inverter circuit INV illustrated in FIG. 2A will be described with reference to FIGS. 2B and 2C.

The ring oscillator illustrated in FIG. 2B self-oscillates in such a manner that an odd number of the inverter circuits INV illustrated in FIG. 2A are connected in series and an output from the output terminal (out) of the last inverter circuit INV(2m−1) (m>0) is fed back to the input terminal (in) of the first inverter circuit INV1. FIG. 2C specifically illustrates the first to three inverter circuits (INV) in the ring oscillator illustrated in FIG. 2B.

The number of power supply lines can be smaller in the ring oscillator illustrated in FIGS. 2B and 2C than in the ring oscillator illustrated in FIGS. 1B and 1C, and as a result, the circuit area of the ring oscillator in FIGS. 2B and 2C can be decreased.

The driving frequency of the inverter circuit INV in FIG. 2A is high because the rise time of the output signal is short as in the inverter circuit illustrated in FIG. 1A. For this reason, configuring the ring oscillator in FIG. 2B by using the inverter circuit INV can increase the oscillation frequency of the ring oscillator. Moreover, with high oscillation frequency, the delay time of the inverter circuit INV can be shortened and the ring oscillator can operate at high speed.

This embodiment can be implemented in combination with any of the structures described in the other embodiments as appropriate.

(Embodiment 2)

In this embodiment, ring oscillators different from those in Embodiment 1 will be described with reference to FIGS. 3A and 3B, FIG. 4, FIGS. 5A and 5B, and FIGS. 6A and 6B.

Figure 3A:
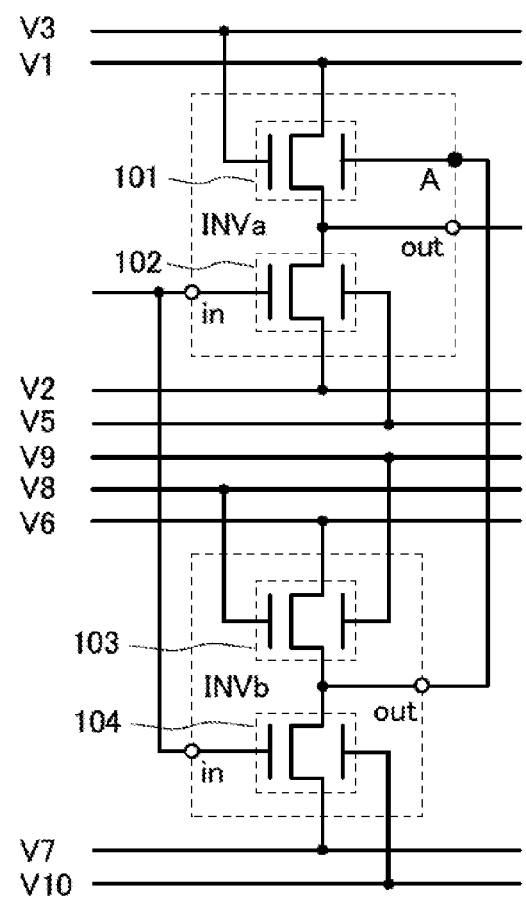
FIGS. 3A and 3B illustrate a logic circuit and a semiconductor device according to one embodiment of the present invention.
Figure 3B:
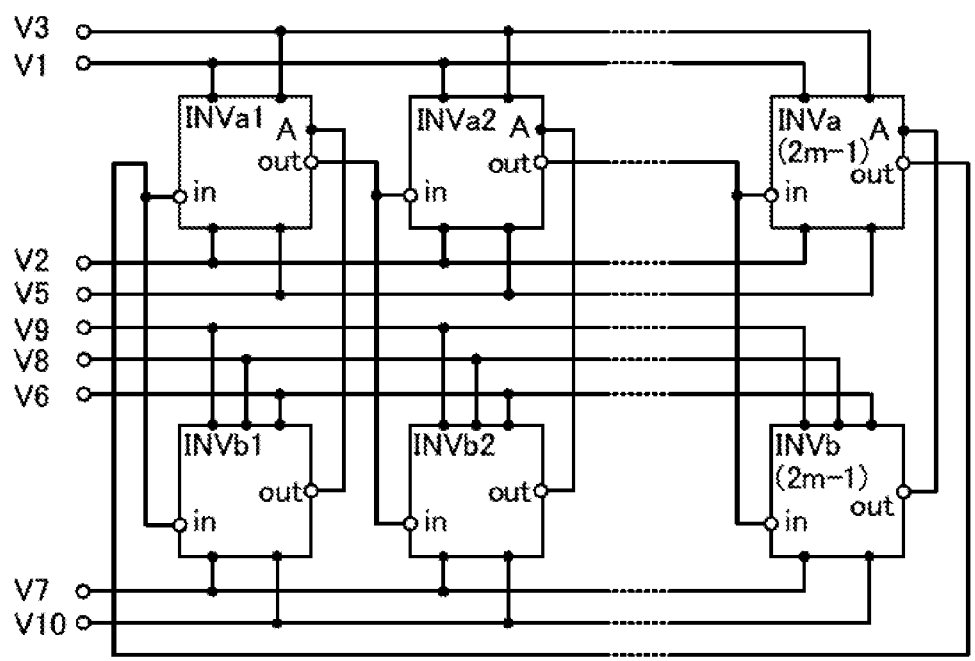

A ring oscillator illustrated in FIG. 3B includes an inverter circuit INVa and a control inverter circuit INVb illustrated in FIG. 3A; the control inverter circuit INVb is used to control a voltage applied to the second gate electrode of the transistor 101 included in the inverter circuit INVa. First, the inverter circuit INVa and the control inverter circuit INVb illustrated in FIG. 3A will be described.

FIG. 3A is a circuit diagram illustrating specific configurations of the inverter circuit INVa and the control inverter circuit INVb. The inverter circuit INVa includes the transistor 101 and the transistor 102. The control inverter circuit INVb includes a transistor 103 and a transistor 104. In the inverter circuit INVa, the transistor 101 and the transistor 102 are connected in series between the power supply line V1 supplied with the power supply potential V1 and the power supply line V2 supplied with the power supply potential V2. In other words, the source electrode of the transistor 101 and the drain electrode of the transistor 102 are electrically connected to each other. Moreover, in the control inverter circuit INVb, the transistor 103 and the transistor 104 are connected in series between a power supply line V6 supplied with a power supply potential V6 and a power supply line V7 supplied with a power supply potential V7. In other words, a source electrode of the transistor 103 and a drain electrode of the transistor 104 are electrically connected to each other.

The transistor 101 and the transistor 102 are transistors of the same conductivity type; therefore, the transistors 101 and 102 can be n-channel transistors or p-channel transistors as long as they have the same conductivity type. In the case where the transistors 101 and 102 are n-channel transistors, the power supply potential V1 is made higher than the power supply potential V2. The power supply potential V2 is, for example, a ground potential or a negative potential. That is, the power supply potential V1 is a high power supply potential and the power supply potential V2 is a low power supply potential. On the other hand, in the case where the transistors 101 and 102 are p-channel transistors, the power supply potential V1 is made lower than the power supply potential V2. The power supply potential V1 is, for example, a ground potential or a negative potential. That is, the power supply potential V1 is a low power supply potential and the power supply potential V2 is a high power supply potential.

Further, the transistor 103 and the transistor 104 are transistors of the same conductivity type; therefore, the transistors 103 and 104 can be n-channel transistors or p-channel transistors as long as they have the same conductivity type. In the case where the transistors 103 and 104 are n-channel transistors, the power supply potential V6 is made higher than the power supply potential V7. The power supply potential V7 is, for example, a ground potential or a negative potential. That is, the power supply potential V6 is a high power supply potential and the power supply potential V7 is a low power supply potential. On the other hand, in the case where the transistors 103 and 104 are p-channel transistors, the power supply potential V6 is made lower than the power supply potential V7. The power supply potential V6 is, for example, a ground potential or a negative potential. That is, the power supply potential V6 is a low power supply potential and the power supply potential V7 is a high power supply potential.

Each of the transistors 101 to 104 includes a semiconductor film in which a channel is formed, a pair of gate electrodes provided so that the semiconductor film is placed therebetween, and a source electrode and a drain electrode provided in contact with the semiconductor film. In each of the transistors, one of the pair of gate electrodes overlaps the semiconductor film with a first gate insulating film placed therebetween, and the other of the pair of gate electrodes overlaps the semiconductor film with a second gate insulating film placed therebetween. Here, one of the pair of gate electrodes is referred to as a first gate electrode, and the other thereof is referred to as a second gate electrode (or a backgate).

For the semiconductor films of the transistors 101 to 104, an oxide semiconductor or a compound semiconductor such as gallium nitride, gallium arsenide, indium arsenide, or indium gallium arsenide can be used.

In this embodiment, an oxide semiconductor film is used as the semiconductor film. In the oxide semiconductor film, a region in which a channel is formed is preferably a region that is highly purified by reduction in impurities and reduction in oxygen vacancies. The highly purified oxide semiconductor (purified OS) is an intrinsic (i-type) semiconductor or a substantially i-type semiconductor. For this reason, a transistor using the above oxide semiconductor for a channel formation region has extremely low off-state current, and its threshold voltage is unlikely to shift in the negative direction (i.e., the transistor easily obtains normally-off characteristics).

In the control inverter circuit INVb, the first gate electrode of the transistor 103 is connected to a power supply line V8 supplied with a power supply potential V8. A drain electrode of the transistor 103 is connected to the power supply line V6 supplied with the power supply potential V6. The second gate electrode of the transistor 103 is connected to a power supply line V9 supplied with a power supply potential V9. The source electrode of the transistor 103 is connected to the drain electrode of the transistor 104 and the output terminal (out). The first gate electrode of the transistor 104 is connected to the input terminal (in). A source electrode of the transistor 104 is connected to the power supply line V7 supplied with the power supply potential V7. The second gate electrode of the transistor 104 is connected to a power supply line V10 supplied with a power supply potential V10.

The configuration of the inverter circuit INVa is partly different from that of the inverter circuit INV illustrated in FIG. 1A. The inverter circuit INVa differs from the inverter circuit INV in that the second gate electrode of the transistor 101 (i.e., a terminal A) is connected to the output terminal (out) of the control inverter circuit INVb.

Although not illustrated, the power supply line V3 is connected to a first potential generator circuit that generates the power supply potential V3, the power supply line V4 is connected to a second potential generator circuit that generates the power supply potential V4, and the power supply line V5 is connected to a third potential generator circuit that generates the power supply potential V5. Each of the first to third potential generator circuits can generate a plurality of potentials. In addition, although not illustrated, the power supply line V8 is connected to a fourth potential generator circuit that generates the power supply potential V8, the power supply line V9 is connected to a fifth potential generator circuit that generates the power supply potential V9, and the power supply line V10 is connected to a sixth potential generator circuit that generates the power supply potential V10. Each of the fourth to sixth potential generator circuits can generate a plurality of potentials.

Next, the operation of the inverter circuit INVa and the control inverter circuit INVb illustrated in FIG. 3A will be described. Here, the case where the transistors 101 to 104 are n-channel transistors is described.

The input terminals of the inverter circuit INVa and the control inverter circuit INVb are connected to each other and supplied with the same input signals.

In the control inverter circuit INVb, the transistor 103 functions as a current source and the transistor 104 functions as a switch. In other words, an inverted signal is output from the output terminal (out) of the control inverter circuit INVb by turning on or off the transistor 104. Thus, the inverter circuit does not work if the current drive capability of the transistor 104 is lower than that of the transistor 103.

In the control inverter circuit INVb, the power supply potential V10 is made substantially the same as or lower than the power supply potential V7, whereby the threshold voltage of the transistor 104 shifts in the positive direction and the transistor 104 thus has normally-off characteristics.

Further, one of the power supply potential V8 and the power supply potential V9 is made substantially the same as or higher than the power supply potential V6 and the other thereof is made positive, whereby the threshold voltage of the transistor 103 shifts in the negative direction and the transistor 103 thus has normally-on characteristics.

An output signal output from the control inverter circuit INVb is input to the second gate electrode of the transistor 101 in the inverter circuit INVa while the first gate electrode of the transistor 101 is supplied with the power supply potential V3 that is substantially the same as the power supply potential V1, whereby the threshold voltage of the transistor 101 is changed in accordance with the output signal output from the control inverter circuit INVb. Thus, the characteristics of the transistor 101 can change to normally-on characteristics or normally-off characteristics.

Moreover, the power supply potential V5 is made substantially the same as or lower than the power supply potential V2, whereby the threshold voltage of the transistor 102 shifts in the positive direction and the transistor 102 thus has normally-off characteristics.

When the low-level potential is input to the input terminal (in) of the control inverter circuit INVb as an input signal in the above-described state, the transistor 104 is turned off. Since the transistor 103 is on, the high-level potential is output from the output terminal (out) of the control inverter circuit INVb as an inverted signal.

The low-level potential is also input to the input terminal (in) of the inverter circuit INVa, so that the transistor 102 is turned off. At this time, the high-level potential output from the control inverter circuit INVb is applied to the second gate electrode of the transistor 101. Thus, the threshold voltage of the transistor 101 shifts in the negative direction, and the transistor 101 has normally-on characteristics. Accordingly, the transistor 101 is turned on, and the high-level potential is output from the output terminal (out) of the inverter circuit INVa.

On the other hand, when the high-level potential is input to the input terminal (in) of the control inverter circuit INVb as the input signal, the transistor 104 is turned on. At this time, although the transistor 103 is on, the current drive capability of the transistor 104 is higher than that of the transistor 103; thus, a larger amount of current flows through the transistor 104 than through the transistor 103. Consequently, the low-level potential is output from the output terminal (out) of the control inverter circuit INVb as the inverted signal.

The high-level potential is also input to the input terminal (in) of the inverter circuit INVa, so that the transistor 102 is turned on. At this time, the low-level potential output from the control inverter circuit INVb is applied to the second gate electrode of the transistor 101. Thus, the threshold voltage of the transistor 101 shifts in the positive direction, and the transistor 101 has normally-off characteristics. Accordingly, the transistor 101 is turned off, so that the low-level potential is output from the output terminal (out) of the inverter circuit INVa.

As illustrated in FIG. 3A, in the control inverter circuit INVb, the second gate electrodes are provided in the transistors 103 and 104 to control the threshold voltages of the transistors 103 and 104 individually, whereby the transistor 103 can have normally-on characteristics and the transistor 104 can have normally-off characteristics.

In the inverter circuit INVa, the second gate electrodes are provided in the transistors 101 and 102 to control the threshold voltages of the transistors 101 and 102 individually, whereby the transistor 101 can have normally-on characteristics or normally-off characteristics and the transistor 102 can have normally-off characteristics.

The normally-on characteristics of the transistor 103 can increase the current drive capability of the transistor 103. As a result, the rise time of the output signal of the control inverter circuit INVb can be shortened as compared to the case where the transistor 103 does not have the second gate electrode. Thus, the driving frequency of the control inverter circuit INVb can be increased. In addition, the normally-off characteristics of the transistor 104 can reduce the off-state leakage current of the transistor 104, leading to reduction in power consumption of the control inverter circuit INVb.

In addition, whether the transistor 101 has normally-on characteristics or normally-off characteristics can be controlled by the output signal of the control inverter circuit INVb. Consequently, the rise time of the output signal of the inverter circuit INVa can be shortened as compared to the case where the transistor 101 does not have the second gate electrode. Thus, the driving frequency of the inverter circuit INVa can be increased. Moreover, the normally-off characteristics of the transistor 101 can suppress the shoot-through current, so that the inverter circuit INVa can enhance the amplitude of the output signal as compared to the inverter circuit INV illustrated in FIG. 1A.

In the inverter circuit INVa, the size of the transistor 101 is preferably smaller than that of the transistor 102 because the transistor 101 needs to have a lower current drive capability than the transistor 102. That is, the channel width (W) (or the ratio (W/L) of channel width (W) to channel length (L)) of the transistor 101 is preferably smaller than that of the transistor 102.

In the control inverter circuit INVb, the size of the transistor 103 is preferably smaller than that of the transistor 104 because the transistor 103 needs to have a lower current drive capability than the transistor 104. That is, the channel width (W) (or the ratio (W/L) of channel width (W) to channel length (L)) of the transistor 103 is preferably smaller than that of the transistor 104.

Next, a ring oscillator including the inverter circuit INVa and the control inverter circuit INVb illustrated in FIG. 3A will be described with reference to FIG. 3B and FIG. 4.

The ring oscillator illustrated in FIG. 3B self-oscillates in such a manner that an odd number of the inverter circuits INVa illustrated in FIG. 3A are connected in series and an output from the output terminal (out) of the last inverter circuit INVa(2m−1)(m>0) is fed back to the input terminal (in) of the first inverter circuit INVa1. In the ring oscillator, the control inverter circuits INVb and the inverter circuits INVa are the same in number. FIG. 4 specifically illustrates the first to three stages in the ring oscillator illustrated in FIG. 3B.

The output terminal (out) of the last inverter circuit INVa (2m−1) is connected to the input terminal (in) of the first inverter circuit INVa1 and the input terminal (in) of the control inverter circuit INVb1. The output terminal (out) of the control inverter circuit INVb1 is connected to the terminal A of the inverter circuit INVa1. The output terminal (out) of the inverter circuit INVa1 is connected to the input terminal (in) of the inverter circuit INVa2 and the input terminal (in) of the control inverter circuit INVb2.

In such a manner, the input terminal of each inverter circuit INVa is connected to the input terminal of the corresponding control inverter circuit INVb, and the output terminal of each control inverter circuit INVb is connected to the second gate electrode of the transistor 101 (the terminal A) of the corresponding inverter circuit INVa.

In the ring oscillator in FIG. 3B, the power supply line V1 is connected to the drain electrode of the transistor 101 in each inverter circuit INVa, the power supply line V2 is connected to the source electrode of the transistor 102 in each inverter circuit INVa, the power supply line V3 is connected to the first gate electrode of the transistor 101 in each inverter circuit INVa, and the power supply line V5 is connected to the second gate electrode of the transistor 102 in each inverter circuit INVa.

Furthermore, the power supply line V6 is connected to the drain electrode of the transistor 103 in each control inverter circuit INVb, the power supply line V7 is connected to the source electrode of the transistor 104 in each control inverter circuit INVb, the power supply line V8 is connected to the first gate electrode of the transistor 103 in each control inverter circuit INVb, the power supply line V9 is connected to the second gate electrode of the transistor 103 in each control inverter circuit INVb, and the power supply line V10 is connected to the second gate electrode of the transistor 104 in each control inverter circuit INVb.

The output terminal of the control inverter circuit INVb is connected to the terminal A of the inverter circuit INVa, whereby whether the transistor 101 has normally-on characteristics or normally-off characteristics can be controlled by the output signal output from the control inverter circuit INVb. Consequently, the rise time of the output signal of the inverter circuit INVa can be shortened as compared to the case where the transistor 101 does not have the second gate electrode. Thus, the driving frequency of the inverter circuit INVa can be increased. For this reason, configuring the ring oscillator in FIG. 3B by using the inverter circuits INVa can increase the oscillation frequency of the ring oscillator. Moreover, with high oscillation frequency, the delay time of each inverter circuit INVa can be shortened and the ring oscillator can operate at high speed. In addition, the normally-off characteristics of the transistor 101 can suppress the shoot-through current, so that the inverter circuit INVa illustrated in FIG. 3A can enhance the amplitude of the output signal as compared to the inverter circuit INV illustrated in FIG. 1A. Thus, the gain of the ring oscillator can be increased, thereby extending the operating range of the ring oscillator.

Alternatively, in the control inverter circuit INVb, the transistor 103 may have normally-off characteristics in such a manner that the power supply potential V8 is made substantially the same as the power supply potential V6 and the power supply potential V9 is made lower than the power supply potential V7 so that the threshold voltage of the transistor 103 shifts in the positive direction. The normally-off characteristics of the transistor 103 can reduce leakage current of the transistor 103, which leads to further reduction in power consumption of the control inverter circuit INVb and reduction in power consumption of the ring oscillator including the control inverter circuit INVb.

Changing the power supply potential V9, which is applied to the second gate electrode of the transistor 103, in the above manner can control increase in the driving frequency due to high-speed operation of the control inverter circuit INVb or reduction in power consumption due to low-speed driving. Accordingly, the transistor 103 preferably has normally-on characteristics when the control inverter circuit INVb is driven at high speed, whereas the transistor 103 preferably has normally-off characteristics when the control inverter circuit INVb is driven at low speed. The power supply potential V9 can be controlled by the fifth potential generator circuit.

Figure 4:
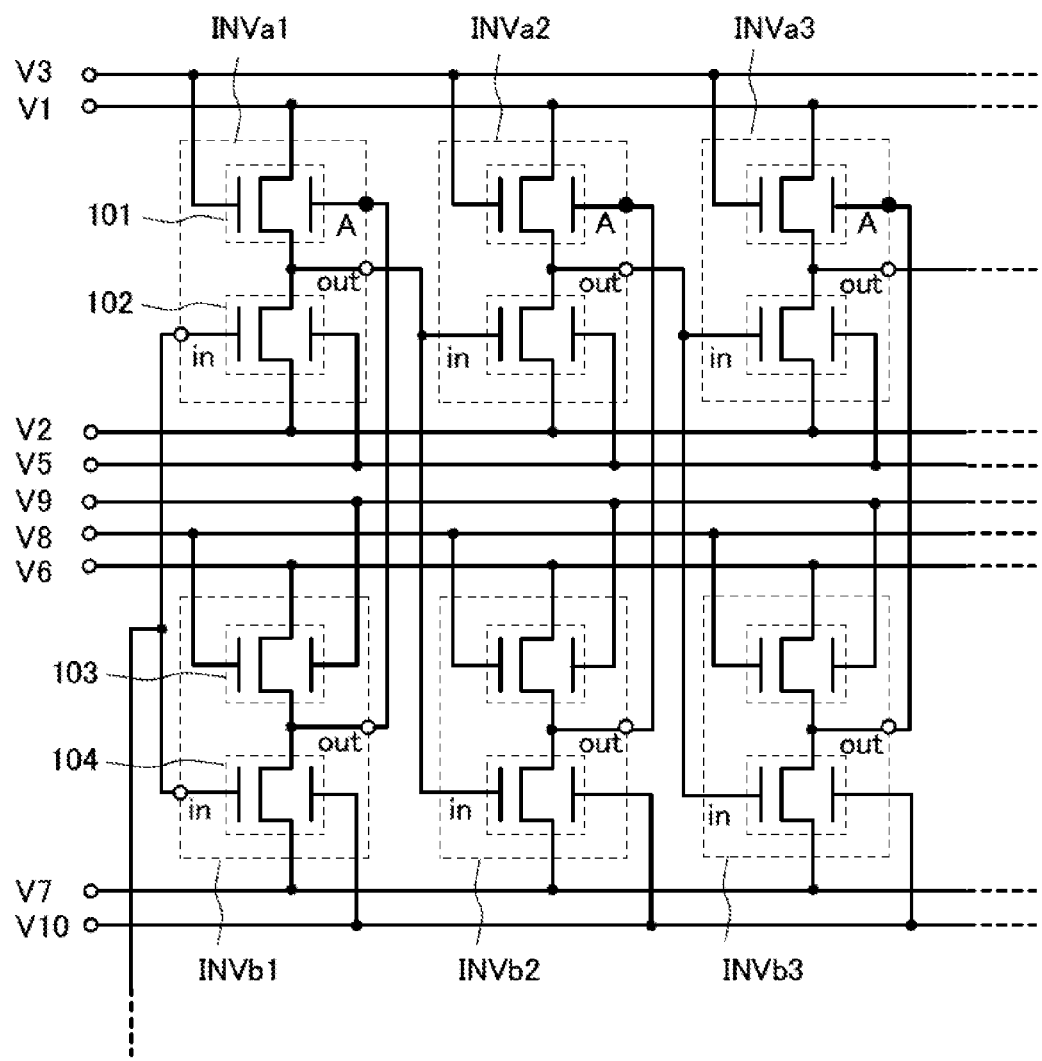
FIG. 4 illustrates a semiconductor device according to one embodiment of the present invention.
Figure 5A:
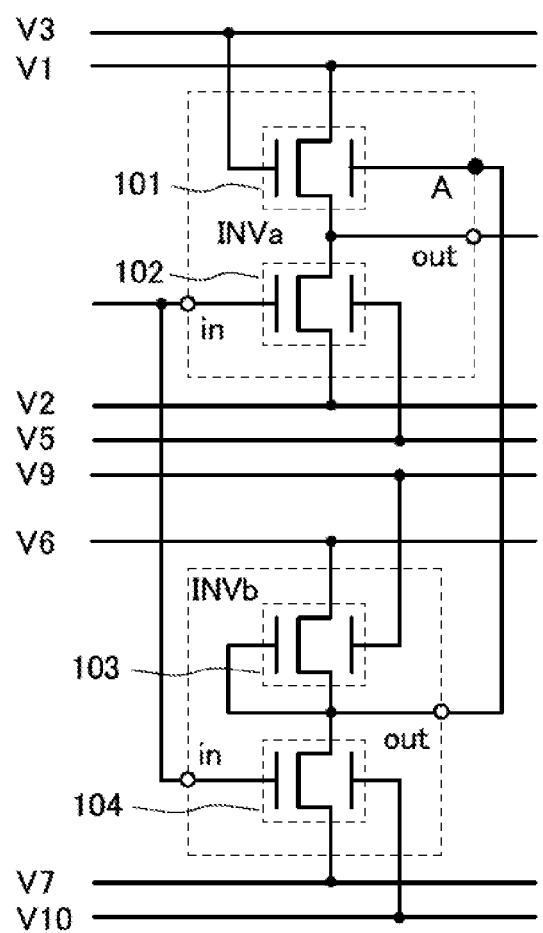
FIGS. 5A and 5B illustrate a logic circuit and a semiconductor device according to one embodiment of the present invention.
Figure 5B:
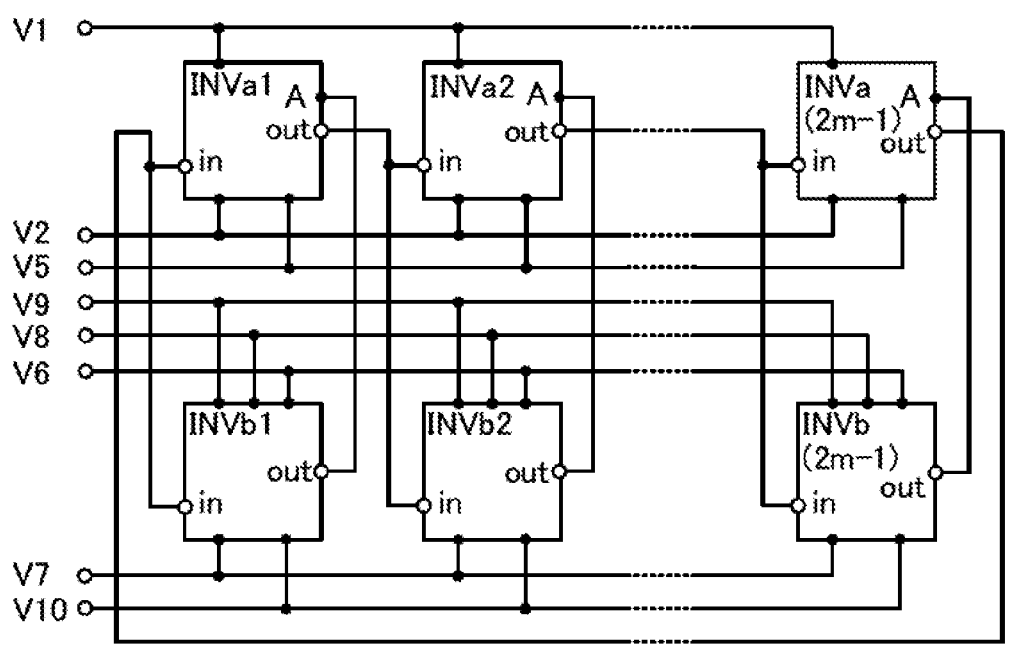

FIGS. 5A and 5B illustrate the inverter circuit INVa, the control inverter circuit INVb, and a ring oscillator that are partly different from those in FIGS. 3A and 3B and FIG. 4.

In the control inverter circuit INVb illustrated in FIG. 5A, the drain electrode of the transistor 103 is connected to the power supply line V6 supplied with the power supply potential V6. The second gate electrode of the transistor 103 is connected to the power supply line V9 supplied with the power supply potential V9. The first gate electrode of the transistor 103 is connected to the source electrode of the transistor 103 and the output terminal (out). Thus, the voltage between the first gate electrode and the source electrode of the transistor 103 is 0 V, so that the transistor 103 is off.

However, the transistor 103 can have normally-on characteristics by making the power supply potential V9 substantially the same as or higher than the power supply potential V1 so that the threshold voltage of the transistor 103 shifts in the negative direction.

The normally-on characteristics of the transistor 103 can increase the current drive capability of the transistor 103. As a result, the rise time of the output signal of the control inverter circuit INVb can be shortened as compared to the case where the transistor 103 does not have the second gate electrode. Thus, the driving frequency of the control inverter circuit INVb can be increased. Further, since the power supply line V8 is not necessarily used, the number of power supply lines can be decreased as compared to the configuration in FIG. 3A.

Note that in the inverter circuit INVa, the size of the transistor 101 is preferably smaller than that of the transistor 102 because the transistor 101 needs to have a lower current drive capability than the transistor 102. That is, the channel width (W) (or the ratio (W/L) of channel width (W) to channel length (L)) of the transistor 101 is preferably smaller than that of the transistor 102.

In the control inverter circuit INVb, the first gate electrode and the source electrode of the transistor 103 are connected to each other (i.e., the transistor 103 is not diode-connected); thus, the current drive capability of the transistor 103 is extremely low. Therefore, the size of the transistor 103 is preferably larger than that of the transistor 104. That is, the channel width (W) (or the ratio (W/L) of channel width (W) to channel length (L)) of the transistor 103 is preferably larger than that of the transistor 104.

A ring oscillator including the inverter circuit INVa and the control inverter circuit INVb illustrated in FIG. 5A will be described with reference to FIG. 5B.

The ring oscillator illustrated in FIG. 5B self-oscillates in such a manner that an odd number of the inverter circuits INVa illustrated in FIG. 5A are connected in series and an output from the output terminal (out) of the last inverter circuit INVa(2m−1) (m>0) is fed back to the input terminal (in) of the first inverter circuit INVa1. In the ring oscillator, the control inverter circuits INVb and the inverter circuits INVa are the same in number.

The number of power supply lines can be smaller in the ring oscillator illustrated in FIG. 5B than in the ring oscillator illustrated in FIG. 4, and as a result, the circuit area of the ring oscillator in FIG. 5B can be decreased.

The driving frequency of the inverter circuit INVa in FIG. 5A is high because the rise time of the output signal is short as in the inverter circuit illustrated in FIG. 3A. For this reason, configuring the ring oscillator in FIG. 5B by using the inverter circuits INVa can increase the oscillation frequency of the ring oscillator. Moreover, with high oscillation frequency, the delay time of each inverter circuit INVa can be shortened and the ring oscillator can operate at high speed. In addition, the normally-off characteristics of the transistor 101 can suppress the shoot-through current, so that the inverter circuit INVa illustrated in FIG. 5A can enhance the amplitude of the output signal as compared to the inverter circuit INV illustrated in FIG. 2A. Thus, the gain of the ring oscillator can be increased, thereby extending the operating range of the ring oscillator.

Figure 6A:
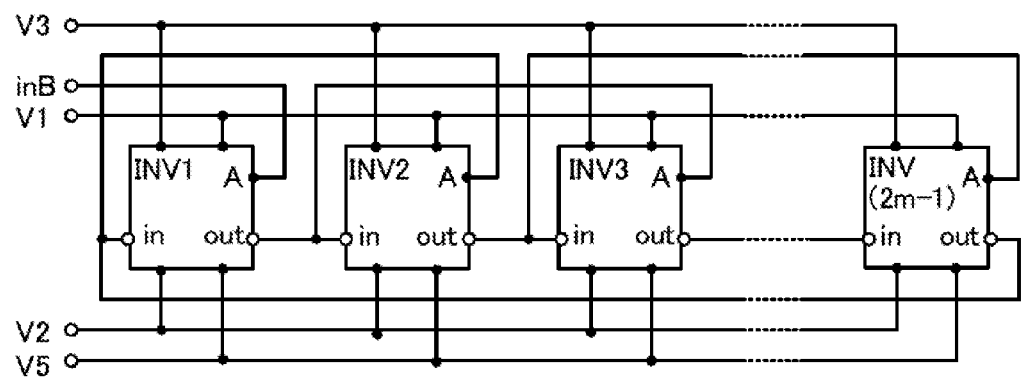
FIGS. 6A and 6B illustrate a semiconductor device according to one embodiment of the present invention.
Figure 6B:
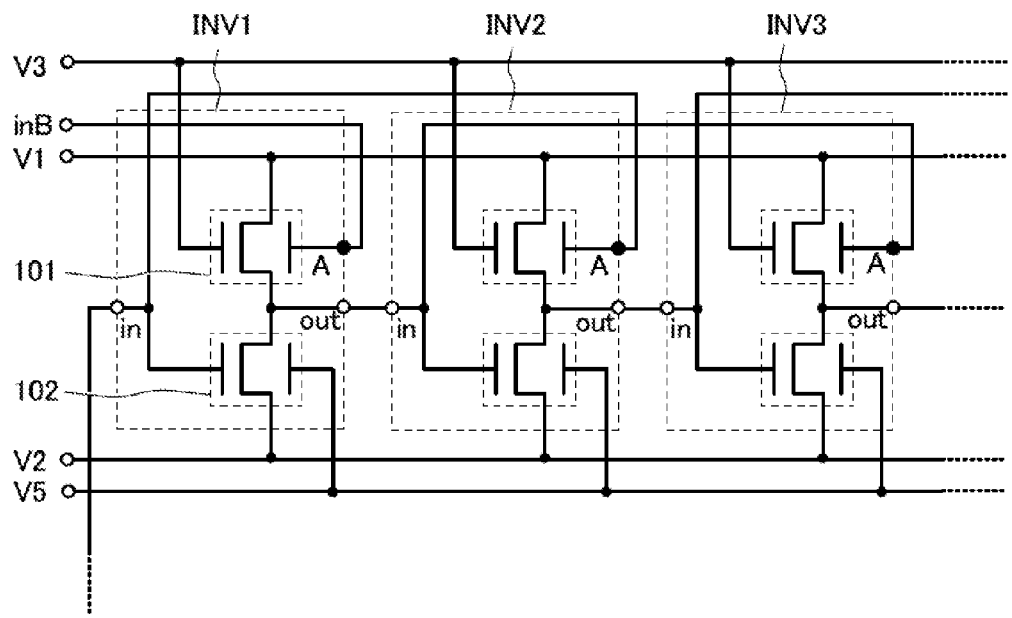

FIGS. 6A and 6B illustrate another embodiment of the ring oscillator. The configuration of the inverter circuit INV used in the ring oscillator illustrated in FIGS. 6A and 6B is similar to that of the inverter circuit INVa illustrated in FIG. 3A.

The ring oscillator illustrated in FIG. 6A self-oscillates in such a manner that an odd number of the inverter circuits INV are connected in series and an output from the output terminal (out) of the last inverter circuit INV(2m−1)(m>0) is fed back to the input terminal (in) of the first inverter circuit INV1. FIG. 6B specifically illustrates the first to three inverter circuits (INV) in the ring oscillator illustrated in FIG. 6A.

As illustrated in FIG. 6B, each of the inverter circuits INV includes the transistor 101 and the transistor 102. In each inverter circuit INV, the transistor 101 and the transistor 102 are connected in series between the power supply line V1 supplied with the power supply potential V1 and the power supply line V2 supplied with the power supply potential V2.

In the first inverter circuit INV 1, the first gate electrode of the transistor 101 is connected to the power supply line V3 supplied with the power supply potential V3. The drain electrode of the transistor 101 is connected to the power supply line V1 supplied with the power supply potential V1. The second gate electrode of the transistor 101 (or the terminal A) is connected to an input terminal in B to which the inverted signal of the input signal is input. The source electrode of the transistor 101 is connected to the drain electrode of the transistor 102 and the output terminal (out). The first gate electrode of the transistor 102 is connected to the input terminal (in) to which an output signal output from the last inverter circuit INV(2m−1) is input. The source electrode of the transistor 102 is connected to the power supply line V2 supplied with the power supply potential V2. The second gate electrode of the transistor 102 is connected to the power supply line V5 supplied with the power supply potential V5.

An output signal output from the first inverter circuit INV1 is output to the input terminal (in) of the next inverter circuit INV2 and the terminal A (the second gate electrode of the transistor 101) of the inverter circuit INV3 after the next inverter circuit.

Thus, as the input signals, the low-level potential is input to the input terminal (in) of each inverter circuit INV, and at the same time, the low-level potential is also input to the terminal A of the corresponding next inverter circuit INV.

Next, the operation of the inverter circuit INV illustrated in FIGS. 6A and 6B will be described. Here, the operation of the inverter circuit INV in which the transistors 101 and 102 are n-channel transistors is described.

For example, when the low-level potential is input to the input terminal (in) of the first inverter circuit INV1 as the input signal, the transistor 102 is turned off. At this time, the high-level potential, which is the inverted signal of the input signal, is applied to the second gate electrode of the transistor 101. Thus, the threshold voltage of the transistor 101 shifts in the negative direction, so that the transistor 101 has normally-on characteristics. Accordingly, the transistor 101 is turned on, and the high-level potential is output from the output terminal (out) of the inverter circuit INV 1.

The output signal output from the inverter circuit INV1 is input to the input terminal (in) of the inverter circuit INV2 and the terminal A (the second gate electrode of the transistor 101) of the inverter circuit INV3.

On the other hand, when the high-level potential is input to the input terminal (in) of the first inverter circuit INV1 as the input signal, the transistor 102 is turned on.

At this time, the low-level potential, which is the inverted signal of the input signal, is applied to the second gate electrode of the transistor 101. Thus, the threshold voltage of the transistor 101 shifts in the positive direction, so that the transistor 101 has normally-off characteristics. Accordingly, the transistor 101 is turned off, and the low-level potential is output from the output terminal (out) of the inverter circuit INV1.

The output signal output from the inverter circuit INV1 is input to the input terminal (in) of the inverter circuit INV2 and the terminal A (the second gate electrode of the transistor 101) of the inverter circuit INV3.

The inverted signal of the input signal is input to the terminal A (the second gate electrode of the transistor 101) of the inverter circuit INV, whereby the transistor 101 can have normally-on characteristics or normally-off characteristics depending on the inverted signal. Thus, the rise time of the output signal of each inverter circuit INV can be shortened, thereby increasing the oscillation frequency of the ring oscillator. Moreover, the delay time of each inverter circuit INV can be shortened. Further, the normally-off characteristics of the transistor 101 can suppress the shoot-through current, so that the amplitude of the output signal of the inverter circuit INV can be enhanced. This can increase the gain of the ring oscillator, thereby extending the operating range of the ring oscillator. In addition, the configuration of the ring oscillator illustrated in FIGS. 6A and 6B can be simpler than those illustrated in FIG. 4 and FIG. 5B.

Note that in the inverter circuit INV, the size of the transistor 101 is preferably smaller than that of the transistor 102 because the transistor 101 needs to have a lower current drive capability than the transistor 102. That is, the channel width (W) (or the ratio (W/L) of channel width (W) to channel length (L)) of the transistor 101 is preferably smaller than that of the transistor 102.

This embodiment can be implemented in combination with any of the structures described in the other embodiments as appropriate.

Embodiment (3)

In this embodiment, a method for fabricating a transistor used in the ring oscillator shown in Embodiments 1 and 2 will be described.

Figure 7A:
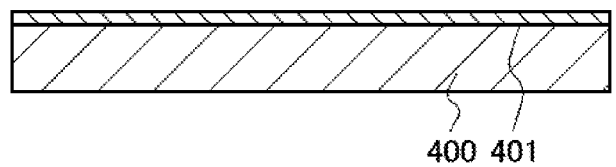
FIGS. 7A to 7F are cross-sectional views illustrating steps of fabricating a semiconductor device.

First, an insulating film 401 is formed over a substrate 400 (see FIG. 7A).

Examples of the substrate 400 are a single crystal semiconductor substrate and a polycrystalline semiconductor substrate containing silicon, silicon carbide, or the like; and a compound semiconductor substrate containing silicon germanium, gallium arsenide, indium phosphide, or the like. Other examples of the substrate 400 are a variety of glass substrates used in the electronics industry, such as substrates of aluminosilicate glass, aluminoborosilicate glass, and barium borosilicate glass, a quartz substrate, a ceramic substrate, and a sapphire substrate.

The insulating film 401 is formed with a single-layer structure or a stacked structure using silicon oxide, silicon oxynitride, silicon nitride, and/or the like. The insulating film 401 is formed by thermal oxidation, CVD, sputtering, or the like. The thickness of the insulating film 401 ranges from 10 nm to 200 nm, preferably from 50 nm to 150 nm.

Figure 7B:
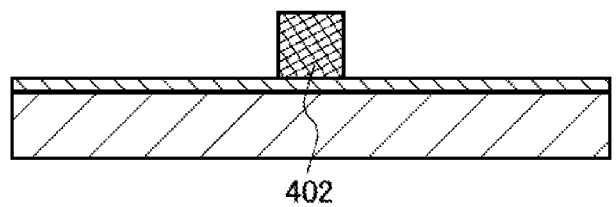

Next, a conductive film for forming a gate electrode (including a wiring formed in the same layer as the gate electrode) is formed over the insulating film 401 and processed to form a gate electrode layer 402 (see FIG. 7B). The gate electrode layer 402 functions as a second gate electrode (backgate).

The gate electrode layer 402 can be formed using a metal material such as molybdenum, titanium, tantalum, tungsten, aluminum, copper, chromium, neodymium, or scandium or an alloy material containing any of these materials as a main component by sputtering, PECVD, or the like. Alternatively, the gate electrode layer 402 can be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. Moreover, the gate electrode layer 402 can have a stacked structure of the above conductive material and the above metal material.

Figure 7C:
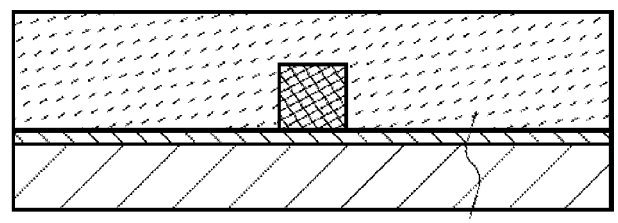

Then, an insulating film 403 is formed over the insulating film 401 and the gate electrode layer 402 (see FIG. 7C).

The insulating film 403 can be formed with a single-layer structure or a stacked structure using an oxide insulating film of silicon oxide, silicon oxynitride, aluminum oxide, aluminum oxynitride, hafnium oxide, gallium oxide, or the like; a nitride insulating film of silicon nitride, silicon nitride oxide, aluminum nitride oxide, or the like; and/or a film containing a mixed material of any of the above materials. The insulating film 403 is formed by thermal oxidation, CVD, sputtering, or the like. The thickness of the insulating film 403 ranges from 10 nm to 200 nm, preferably from 50 nm to 150 nm.

Figure 7D:
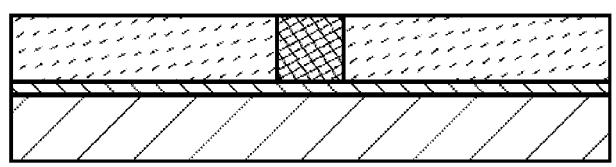

Next, planarization treatment is performed on the insulating film 403 until an upper surface of the gate electrode layer 402 is exposed (see FIG. 7D).

As the planarization treatment for the insulating film 403, polishing treatment such as chemical mechanical polishing (hereinafter referred to as CMP treatment), etching treatment, plasma treatment, or the like can be used.

The CMP treatment is treatment for planarizing a surface of an object to be processed by a combination of chemical and mechanical actions. Specifically, in the CMP treatment, a polishing cloth is attached to a polishing stage, the polishing stage and an object are rotated or swung while a slurry (an abrasive) is supplied between the object and the polishing cloth, and the surface of the object is polished by a chemical reaction between the slurry and the object and by action of mechanical polishing of the polishing cloth on the object.

As the plasma treatment, reverse sputtering in which an argon gas is introduced and plasma is produced can be performed, for example. The reverse sputtering is a method in which voltage is applied to the substrate side with the use of an RF power source in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to the surface of the insulating film 403.

As the planarization treatment, polishing treatment, dry etching treatment, or plasma treatment may be performed plural times, or these treatments may be performed in combination. When treatments are performed in combination, there is no particular limitation on the order of steps, and the order can be set as appropriate in accordance with the roughness of the surface of the insulating film 403.

With the planarization treatment on the insulating film 403, the average surface roughness ($R_a$) of the surface of the insulating film 403 can be reduced to 1 nm or less, preferably 0.3 nm or less, more preferably 0.1 nm or less. Note that in this specification and the like, average surface roughness ($R_a$) is obtained by expanding arithmetic mean surface roughness, which is defined by JIS B 0601:2001 (ISO4287:1997), into three dimensions so as to be applied to a curved surface, and is an average value of the absolute values of deviations from a reference surface to a specific surface.

When a specific surface is expressed as z=F(X,Y), the average surface roughness ($R_a$) is an average value of the absolute values of deviations from the reference surface to the specific surface and is shown by Formula 1.

$$Ra = \frac{1}{S_0} \int_{Y_1}^{Y_2} \int_{X_1}^{X_2} |F(X, Y) - Z_0| \, dX \, dY \quad \text{[Formula 1]}$$

Here, the specific surface is a surface that is a target of roughness measurement, and is a quadrilateral region specified by four points represented by the coordinates ($X_1$, $Y_1$, $F(X_1, Y_1)$), ($X_1$, $Y_2$, $F(X_1, Y_2)$), ($X_2$, $Y_1$, $F(X_2, Y_1)$), and ($X_2$, $Y_2$, $F(X_2, Y_2)$). Moreover, $S_0$ represents the area of a rectangle obtained by projecting the specific surface on the XY plane, and $Z_0$ represents the height of the reference surface (the average height of the specific surface). The average surface roughness ($R_a$) can be measured with an atomic force microscope (AFM).

Figure 7E:
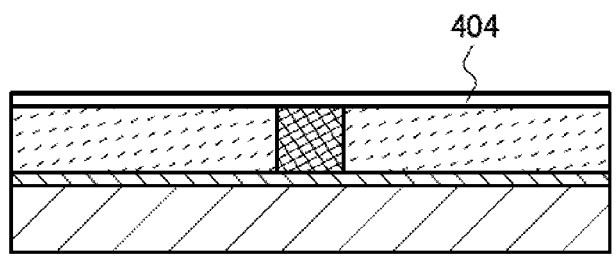

Next, a gate insulating film 404 is formed over the gate electrode layer 402 and the insulating film 403 (see FIG. 7E). The gate insulating film 404 functions as a second gate insulating film.

The gate insulating film 404 can be formed using silicon oxide, gallium oxide, aluminum oxide, silicon nitride, silicon oxynitride, aluminum oxynitride, or silicon nitride oxide. When the gate insulating film 404 is formed using a high-k material such as hafnium oxide, yttrium oxide, hafnium silicate ($HfSi_xO_y$ (x>0, y>0)), hafnium silicate to which nitrogen is added ($HfSiO_xN_y$ (x>0, y>0)), hafnium aluminate ($HfAl_xO_y$ (x>0, y>0)), or lanthanum oxide, the gate leakage current can be reduced. The gate insulating film 404 can be formed with a single-layer structure or a stacked structure using any of the above materials.

The gate insulating film 404 can be formed by sputtering, MBE, plasma CVD, pulsed laser deposition, ALD, or the like. The thickness of the gate insulating film 404 ranges from 1 nm to 500 nm, preferably from 10 nm to 300 nm.

Then, heat treatment may be performed on the substrate 400, the gate electrode layer 402, the gate insulating film 404, and the like. For example, the heat treatment may be performed with a GRTA apparatus at 650° C. for 1 to 10 minutes. Alternatively, the heat treatment may be performed with an electric furnace at 350° C. to 500° C. for 30 minutes to 1 hour. The heat treatment can remove hydrogen, water, and the like contained in the gate insulating film 404.

Note that in an oxide semiconductor film that is formed later, hydrogen, an alkali metal element, an alkaline earth metal, a metal element such as copper, and elements that are not constituent elements of the oxide semiconductor film might be impurities. In addition, molecules containing these elements (e.g., water and a hydrogen compound) and the like might be impurities. However, the term "impurities" excludes a dopant that is intentionally added to the oxide semiconductor.

Next, treatment for adding oxygen (also referred to as oxygen addition treatment or oxygen implantation treatment) may be performed on the gate insulating film 404. With the oxygen addition treatment, an oxygen excess region is formed in the gate insulating film 404.

Oxygen includes at least one of an oxygen radical, ozone, an oxygen atom, and an oxygen ion (including a molecular ion and a cluster ion). By the oxygen addition treatment performed on the dehydrated or dehydrogenated gate insulating film 404, oxygen can be contained in the gate insulating film 404 to compensate for oxygen that has been released by the above heat treatment and to form an oxygen excess region.

Oxygen can be added to the gate insulating film 404 by ion implantation, ion doping, plasma immersion ion implantation, or plasma treatment, for example. A gas cluster ion beam may be used for ion implantation. Oxygen may be added to the entire surface of the substrate at one time or may be added using a linear ion beam, for example. In the case of using the linear ion beam, oxygen can be added to the entire surface of the gate insulating film 404 by moving the substrate or the ion beam (by scanning the substrate with the ion beam). As the plasma treatment, ashing treatment may be used.

As a gas for supplying oxygen, a gas containing O, such as an $O_2$ gas, an $N_2O$ gas, a $CO_2$ gas, a CO gas, or an $NO_2$ gas, can be used. Note that a rare gas (e.g., Ar) may be contained in the gas for supplying oxygen.

For example, when oxygen is added by ion implantation, the dosage of the oxygen is preferably $1\times10^{13}$ ions/cm$^2$ to $5\times10^{16}$ ions/cm$^2$, and the oxygen content of the gate insulating film 404 after the oxygen addition treatment preferably exceeds that of the stoichiometric composition of the gate insulating film 404. Note that such a region containing oxygen in excess of the stoichiometric composition exists in at least part of the gate insulating film 404. The depth at which oxygen is implanted can be adjusted as appropriate by implantation conditions.

The gate insulating film 404 containing excess oxygen, which serves as an oxygen supply source, is provided in contact with the oxide semiconductor film formed later, whereby oxygen is released from the gate insulating film 404 by heat treatment performed after the formation of the oxide semiconductor film and thus can be supplied to the oxide semiconductor film. Consequently, oxygen vacancies in the oxide semiconductor film can be reduced.

Note that the treatment for adding oxygen to the gate insulating film 404 may be performed before the heat treatment of the gate insulating film 404, or may be performed before and after the heat treatment of the gate insulating film 404.

Figure 7F:
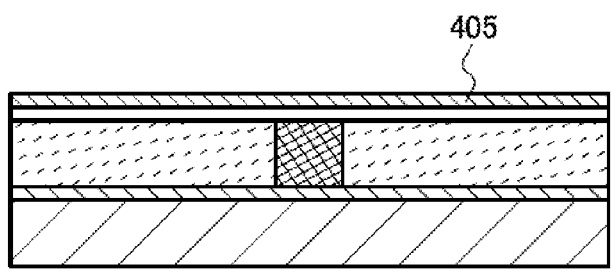

Then, an oxide semiconductor film 405 is formed over the gate insulating film 404 (see FIG. 7F).

The oxide semiconductor film 405 can be formed by sputtering, molecular beam epitaxy (MBE), CVD such as LPCVD, PECVD, or mist CVD, pulsed laser deposition, ALD, or the like as appropriate. The thickness of the oxide semiconductor film 405 ranges from 1 nm to 200 nm, preferably from 5 nm to 50 nm.

An oxide semiconductor used for the oxide semiconductor film 405 contains at least indium (In). In particular, the oxide semiconductor film 405 preferably contains indium (In) and zinc (Zn). Moreover, in addition to indium and/or zinc, the oxide semiconductor film 405 preferably contains gallium (Ga) as a stabilizer that reduces variations in electrical characteristics among transistors using the oxide semiconductor. Further, it is preferable that one or more elements selected from tin (Sn), hafnium (Hf), aluminum (Al), and zirconium (Zr) be contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, any of the following oxides can be used, for example: oxides of three metal elements such as an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, and an In—Lu—Zn-based oxide; and oxides of four metal elements such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

The oxide semiconductor film 405 may be in a non-single-crystal state, for example. The non-single-crystal state is, for example, structured by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as a CAAC-OS (c-axis aligned crystalline oxide semiconductor).

For example, the oxide semiconductor film 405 may include a CAAC-OS. In the CAAC-OS, for example, c-axes are aligned, and a-axes and/or b-axes are not macroscopically aligned.

For example, the oxide semiconductor film 405 may include microcrystal. Note that an oxide semiconductor including microcrystal is referred to as a microcrystalline oxide semiconductor. A microcrystalline oxide semiconductor film includes microcrystal (also referred to as nanocrystal) with a size greater than or equal to 1 nm and less than 10 nm, for example. Alternatively, a microcrystalline oxide semiconductor film, for example, includes a crystal-amorphous mixed phase structure where crystal parts (each of which is greater than or equal to 1 nm and less than 10 nm) are distributed.

For example, the oxide semiconductor film 405 may include an amorphous part. Note that an oxide semiconductor including an amorphous part is referred to as an amorphous oxide semiconductor. An amorphous oxide semiconductor film, for example, has disordered atomic arrangement and no crystalline component. Alternatively, an amorphous oxide semiconductor film is, for example, absolutely amorphous and has no crystal part.

The oxide semiconductor film 405 may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked structure including a region of an amorphous oxide semiconductor, a region of a microcrystalline oxide semiconductor, and a region of a CAAC-OS, for example.

Note that the oxide semiconductor film 405 may be in a single-crystal state, for example.

The oxide semiconductor film 405 preferably includes a plurality of crystal parts. In each of the crystal parts, the c-axis is preferably aligned in a direction parallel to a normal vector of a surface where the oxide semiconductor film is formed or a normal vector of a surface of the oxide semiconductor film. Note that among crystal parts, the directions of the a-axis and the b-axis of one crystal part may be different from those of another crystal part. An example of such an oxide semiconductor film is a CAAC-OS film.

The CAAC-OS film is not absolutely amorphous. The CAAC-OS film, for example, includes an oxide semiconductor with a crystal-amorphous mixed phase structure where crystal parts and amorphous parts are intermingled. Note that in most cases, the crystal part fits inside a cube whose one side is less than 100 nm. In an image obtained with a transmission electron microscope (TEM), a boundary between an amorphous part and a crystal part and a boundary between crystal parts in the CAAC-OS film are not clearly detected. Further, with the TEM, a grain boundary in the CAAC-OS film is not clearly found. Thus, a reduction in electron mobility due to the grain boundary is suppressed in the CAAC-OS film.

In each of the crystal parts included in the CAAC-OS film, for example, the c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seem from the direction perpendicular to the c-axis. Note that among crystal parts, the directions of the a-axis and the b-axis of one crystal part may be different from those of another crystal part. In this specification, the term "perpendicular" includes a range from 80° to 100°, preferably from 85° to 95°. In addition, the term "parallel" includes a range from −10° to 10°, preferably from −5° to 5°.

In the CAAC-OS film, distribution of crystal parts is not necessarily uniform. For example, in the formation process of the CAAC-OS film, in the case where crystal growth occurs from the surface side of the oxide semiconductor film, the proportion of crystal parts in the vicinity of the surface of the oxide semiconductor film is sometimes higher than that in the vicinity of the surface where the oxide semiconductor film is formed. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

With the use of the CAAC-OS film in a transistor, variation in electrical characteristics of the transistor due to irradiation with visible light or ultraviolet light is small. Thus, the transistor has high reliability.

Note that part of oxygen included in the oxide semiconductor film may be substituted with nitrogen.

In an oxide semiconductor film having a crystal part like the CAAC-OS film, defects in the bulk can be further reduced, and the carrier mobility higher than that of an amorphous oxide semiconductor can be obtained by increase in the flatness of a surface of the oxide semiconductor film. In order to increase the surface flatness, the oxide semiconductor film 405 is preferably formed on a flat surface. Specifically, the oxide semiconductor film 405 is preferably formed on a surface with an average surface roughness ($R_a$) of 1 nm or less, preferably 0.3 nm or less, more preferably 0.1 nm or less.

In order to increase the flatness of the surface where the oxide semiconductor film 405 is formed, planarization treatment is preferably performed on part of the gate insulating film 404 in contact with the oxide semiconductor film 405. There is no particular limitation on the planarization treatment; polishing treatment (such as chemical mechanical polishing (CMP)), dry etching treatment, or plasma treatment can be used.

As the planarization treatment, polishing treatment, dry etching treatment, or plasma treatment may be performed plural times, or these treatments may be performed in combination. When treatments are performed in combination, there is no particular limitation on the order of steps, and the order can be set as appropriate in accordance with the roughness of the surface of the gate insulating film 404.

Note that the oxide semiconductor film 405 with a single-layer structure is formed in FIG. 7F; alternatively, an oxide semiconductor film with a stacked structure may be formed. For example, the oxide semiconductor film 405 may be a stack of a first oxide semiconductor film and a second oxide semiconductor film that are formed using metal oxides with different compositions. For example, the first oxide semiconductor film may be formed using a metal oxide of three metal elements, and the second oxide semiconductor film may be formed using a metal oxide of two metal elements. Alternatively, for example, both the first oxide semiconductor film and the second oxide semiconductor film may be formed using a metal oxide of three metal elements.

Further, it is possible that the constituent elements of the first oxide semiconductor film and the second oxide semiconductor film are the same and the composition ratio of the constituent elements is different between the first oxide semiconductor film and the second oxide semiconductor film. For example, the first oxide semiconductor film may have an atomic ratio of In:Ga:Zn=1:1:1, and the second oxide semiconductor film may have an atomic ratio of In:Ga:Zn=3:1:2. Alternatively, the first oxide semiconductor film may have an atomic ratio of In:Ga:Zn=1:3:2, and the second oxide semiconductor film may have an atomic ratio of In:Ga:Zn=2:1:3.

In this case, in one of the first oxide semiconductor film and the second oxide semiconductor film, which is closer to a first gate electrode (is positioned on the channel side), the In content is preferably larger than the Ga content. In the other oxide semiconductor film, which is farther from the first gate electrode (is positioned on the back channel side), the In content is preferably smaller than or equal to the Ga content.

In an oxide semiconductor, the s orbital of heavy metal mainly contributes to carrier transfer, and overlap of the s orbitals is likely to increase when the In content in the oxide semiconductor is increased. Therefore, an oxide in which the In content is larger than the Ga content has higher mobility than an oxide in which the In content is smaller than or equal to the Ga content. Further, the formation energy of oxygen vacancy is larger and thus oxygen vacancy is less likely to occur in Ga than in In; thus, the oxide in which the In content is smaller than or equal to the Ga content has more stable characteristics than the oxide in which the In content is larger than the Ga content.

An oxide semiconductor in which the In content is larger than the Ga content is used on the channel side and an oxide semiconductor in which the In content is smaller than or equal to the Ga content is used on the back channel side, whereby the mobility and reliability of the transistor can be further increased.

Further, oxide semiconductors having different crystallinities may be used for the first oxide semiconductor film and the second oxide semiconductor film. That is, the first oxide semiconductor film and the second oxide semiconductor film may be formed by using a combination of any of a single crystal oxide semiconductor, a polycrystalline oxide semiconductor, an amorphous oxide semiconductor, and a CAAC-OS as appropriate. When an amorphous oxide semiconductor is used for at least one of the first oxide semiconductor film and the second oxide semiconductor film, internal stress or external stress of the oxide semiconductor film 405 is relieved, variations in characteristics of transistors are reduced, and the reliability of the transistors can be further increased.

On the other hand, an amorphous oxide semiconductor is likely to absorb impurities such as hydrogen and is likely to generate an oxygen vacancy, and thus easily becomes n-type. Thus, the oxide semiconductor film on the channel side is preferably formed using a crystalline oxide semiconductor such as a CAAC-OS.

Further, the oxide semiconductor film 405 may have a stacked structure including three or more layers where an amorphous oxide semiconductor film is sandwiched between a plurality of crystalline oxide semiconductor films. Moreover, the oxide semiconductor film 405 may have a structure in which a crystalline oxide semiconductor film and an amorphous oxide semiconductor film are alternately stacked.

The above-described structures used when the oxide semiconductor film 405 has a stacked structure of a plurality of layers can be employed in combination as appropriate.

In the case where the oxide semiconductor film 405 has a stacked structure including a plurality of layers, treatment for adding oxygen may be performed each time the oxide semiconductor film is formed. For the treatment for adding oxygen, heat treatment under an oxygen atmosphere, ion implantation, ion doping, plasma immersion ion implantation, plasma treatment performed under an atmosphere containing oxygen, or the like can be employed.

Oxygen is added each time the oxide semiconductor film is formed, whereby the effect of reducing oxygen vacancies in the oxide semiconductor can be improved.

Further, the concentration of hydrogen or water contained in the oxide semiconductor film 405 is preferably as low as possible. This is because if the concentration of hydrogen is high, electrons serving as carries might be generated by a bond of hydrogen and an element contained in the oxide semiconductor.

Therefore, in order to prevent the oxide semiconductor film 405 from containing impurities as much as possible in the step of forming the oxide semiconductor film 405, it is preferable to preheat the substrate provided with the gate insulating film 404 in a preheating chamber of a sputtering apparatus as pretreatment for formation of the oxide semiconductor film 405 so that impurities in the substrate and the gate insulating film 404 are eliminated and removed. As an evacuation means, a cryopump is preferably provided in the preheating chamber.

The oxide semiconductor film 405 is preferably formed under a condition such that much oxygen is contained during the film formation (e.g., by sputtering in an atmosphere containing oxygen at a concentration of 30% to 100%) so as to be a film containing much oxygen (preferably including a region where the oxygen content is higher than that in the stoichiometric composition of the oxide semiconductor in a crystalline state).

A high-purity gas from which impurities are removed is preferably used as a gas used for forming the oxide semiconductor film 405.

The substrate is held in a deposition chamber kept under reduced pressure. Then, the oxide semiconductor film 405 is deposited over the substrate at temperatures from 130° C. to 700° C. by using a gas containing less impurities and an oxide semiconductor target while moisture remaining in the deposition chamber is removed. In order to remove moisture remaining in the deposition chamber, an entrapment vacuum pump such as a cryopump, an ion pump, or a titanium sublimation pump is preferably used. As an exhaustion unit, a turbo molecular pump to which a cold trap is added may be used. For example, the remaining moisture can be efficiently evacuated particularly by using a cryopump or a cold trap, thereby reducing the concentration of impurities in the oxide semiconductor film 405 formed in the deposition chamber.

Note that in this embodiment, a 35-nm-thick In—Ga—Zn-based oxide film (IGZO film) is formed as the oxide semiconductor film 405 by sputtering using a sputtering apparatus including an AC power supply device. In this embodiment, an In—Ga—Zn-based oxide target having an atomic ratio of In:Ga:Zn=3:1:2 is used. The deposition conditions are as follows: the atmosphere is oxygen and argon (the flow rate ratio of oxygen is 50%), the pressure is 0.4 Pa, the power from the power supply is 0.5 kW with an electrode area of 6000 cm$^2$, and the substrate temperature is 200° C.

The gate insulating film 404 and the oxide semiconductor film 405 are preferably formed in succession without exposing the gate insulating film 404 to the air after the gate insulating film 404 is formed. Forming the gate insulating film 404 and the oxide semiconductor film 405 in succession without exposing the gate insulating film 404 to the air can prevent impurities from being contained in the surface of the gate insulating film 404.

Here, heat treatment may be performed on the oxide semiconductor film 405 in order to remove excess hydrogen (including water and a hydroxyl group) (to perform dehydration or dehydrogenation). The temperature of the heat treatment is higher than or equal to 300° C. and lower than or equal to 700° C., or lower than the strain point of the substrate. The heat treatment can be performed under reduced pressure, an oxygen atmosphere, a nitrogen atmosphere, or the like. Note that an oxygen gas can be replaced with a broader term, an oxidizing gas atmosphere. For example, the atmosphere for the heat treatment may be an atmosphere containing any of oxygen, dinitrogen monoxide, and ozone, which are an oxidizing gas, or ultra-dry air (air with a moisture amount of 20 ppm (−55° C. by conversion into a dew point) or less, preferably 1 ppm or less, more preferably 10 ppb or less in the measurement with a dew point meter of a cavity ring down laser spectroscopy (CRDS) system).

In this embodiment, with the use of an electric furnace, which is one of heat treatment apparatuses, the oxide semiconductor film 405 is subjected to heat treatment at 450° C. for 1 hour in a nitrogen atmosphere and then subjected to heat treatment at 450° C. for 1 hour in an atmosphere containing nitrogen and oxygen.

Note that a heat treatment apparatus is not limited to an electric furnace, and a device for heating an object by heat conduction or heat radiation from a heating element such as a resistance heating element may be alternatively used. For example, an RTA apparatus such as an LRTA apparatus or a GRTA apparatus can be used. For example, as the heat treatment, GRTA may be performed as follows: the substrate is put in an inert gas heated at a high temperature of 650° C. to 700° C., is heated for several minutes, and is taken out of the inert gas.

Note that in the heat treatment, it is preferable that water, hydrogen, and the like be not contained in nitrogen, oxygen, or a rare gas such as helium, neon, or argon. Alternatively, it is preferable that the purity of the gas used in a heat treatment apparatus be 6N (99.9999%) or higher, preferably 7N (99.99999%) or higher (i.e., the impurity concentration be 1 ppm or lower, preferably 0.1 ppm or lower).

In addition, the oxide semiconductor film 405 may be heated under reduced pressure or in an inert atmosphere and then heated in an oxygen atmosphere. If oxygen vacancies are generated by the heat treatment performed under reduced pressure or in an inert atmosphere while impurities in the oxide semiconductor film 405 are removed, oxygen vacancies in the oxide semiconductor film 405 can be reduced by the heat treatment performed later in an oxygen atmosphere.

The heat treatment for dehydration or dehydrogenation may be performed before or after the oxide semiconductor film is processed into an island shape. The heat treatment for dehydration or dehydrogenation may be performed plural times and may also serve as another heat treatment. The heat treatment performed on the oxide semiconductor film 405 can increase the crystallinity of the oxide semiconductor film 405.

When the heat treatment for dehydration or dehydrogenation is performed before the oxide semiconductor film 405 is processed into an island shape, that is, while the oxide semiconductor film covers the gate insulating film 404, oxygen contained in the gate insulating film 404 can be prevented from being released to the outside by the heat treatment.

Figure 8A:
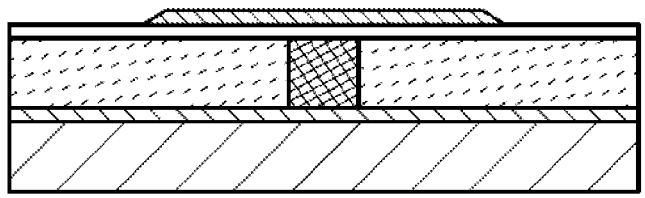
FIGS. 8A to 8D are cross-sectional views illustrating steps of fabricating a semiconductor device.

Next, in a photolithography process, a resist mask is formed over the oxide semiconductor film 405 and selective etching is performed on the oxide semiconductor film 405, so that the island-shaped oxide semiconductor film 405 is formed (see FIG. 8A). The resist mask is removed after the island-shaped oxide semiconductor film 405 is formed. A resist mask for forming the island-shaped oxide semiconductor film 405 may be formed by an inkjet method, in which case the manufacturing costs can be reduced because a photomask is not used.

The oxide semiconductor film 405 may be etched by wet etching, dry etching, or both dry etching and wet etching. As an etchant used for wet etching of the oxide semiconductor film 405, a mixed solution of phosphoric acid, acetic acid, and nitric acid can be used, for example. Alternatively, ITO-07N (produced by Kanto Chemical Co., Inc.) may be used. Further alternatively, the oxide semiconductor film 405 may be etched by dry etching using an inductively coupled plasma (ICP) etching method.

The oxide semiconductor film 405 is preferably etched with a sufficiently high etching selectivity of the oxide semiconductor film 405 to the gate insulating film 404 so that the gate insulating film 404 is not etched excessively.

Figure 8B:
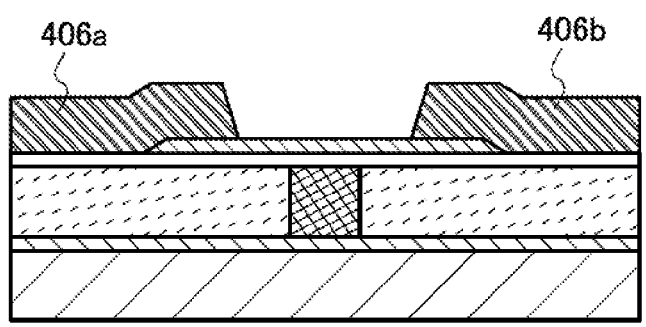

Next, a conductive film that is to be a source electrode layer and a drain electrode layer (including a wiring formed in the same layer as the source and drain electrode layers) is formed over the gate insulating film 404 and the oxide semiconductor film 405, and the conductive film is processed to form a source electrode layer 406a and a drain electrode layer 406b (see FIG. 8B).

The source electrode layer 406a and the drain electrode layer 406b can be formed using a metal material such as molybdenum, titanium, tantalum, tungsten, aluminum, copper, chromium, neodymium, or scandium or an alloy material containing any of these materials as a main component by sputtering, PECVD, or the like. Alternatively, the source electrode layer 406a and the drain electrode layer 406b can be formed using a metal nitride material such as tungsten nitride, tantalum nitride, titanium nitride, or molybdenum nitride. Further alternatively, the source electrode layer 406a and the drain electrode layer 406b can be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. Moreover, the source electrode layer 406a and the drain electrode layer 406b can have a stacked structure of the above conductive material and the above metal material.

As impurities, a constituent element of the source electrode layer 406a and the drain electrode layer 406b, an element existing in the process chamber, and a constituent element of the etching gas used for the etching are sometimes attached to an exposed surface of the oxide semiconductor film 405, which is exposed by the formation of the source electrode layer 406a and the drain electrode layer 406b.

Such attachment of impurities tends to bring an increase in the off-state current of the transistor or deterioration of the electrical characteristics of the transistor. Further, a parasitic channel tends to be generated in the oxide semiconductor film 405, so that electrodes that should be electrically isolated from each other are likely to be electrically connected through the oxide semiconductor film 405.

For this reason, cleaning treatment for removing impurities attached to an upper surface and side surfaces of the oxide semiconductor film 405 (impurity removal treatment) may be performed after the etching for forming the source electrode layer 406a and the drain electrode layer 406b finishes.

The impurity removal treatment can be performed by plasma treatment or treatment with a solution. As the plasma treatment, oxygen plasma treatment, dinitrogen monoxide plasma treatment, or the like can be used. In addition, a rare gas (typically argon) may be used in the plasma treatment.

For the cleaning treatment using a solution, an alkaline solution such as a TMAH solution, water, or an acidic solution such as dilute hydrofluoric acid can be used. For example, in the case of using dilute hydrofluoric acid, 50 wt % hydrofluoric acid is diluted with water to a dilution factor of $10^2$ to $10^5$, preferably $10^3$ to $10^5$. That is, dilute hydrofluoric acid having a concentration of $5\times10^{-4}$ wt % to 0.5 wt %, preferably $5\times10^{-4}$ wt % to $5\times10^{-2}$ wt % is preferably used for the cleaning treatment. By the cleaning treatment, the impurities attached to the exposed surface of the oxide semiconductor film 405 can be removed.

Further, with the impurity removal treatment using a dilute hydrofluoric acid solution, the exposed surface of the oxide semiconductor film 405 can be etched. That is, impurities attached to the exposed surface of the oxide semiconductor film 405 or impurities entering the vicinity of the surface of the oxide semiconductor film 405 can be removed together with part of the oxide semiconductor film 405.

By performing the impurity removal treatment, the chlorine concentration at the surface of the oxide semiconductor film can be reduced to $1\times10^{19}/cm^3$ or lower (preferably $5\times10^{18}/cm^3$ or lower, more preferably $1\times10^{18}/cm^3$ or lower) in a concentration peak obtained by SIMS. The boron concentration can be reduced to $1\times10^{19}/cm^3$ or lower (preferably $5\times10^{18}/cm^3$ or lower, more preferably $1\times10^{18}/cm^3$ or lower). The aluminum concentration can be reduced to $1\times10^{19}/cm^3$ (preferably $5\times10^{18}/cm^3$ or lower, more preferably $1\times10^{18}/cm^3$ or lower).

Figure 8C:
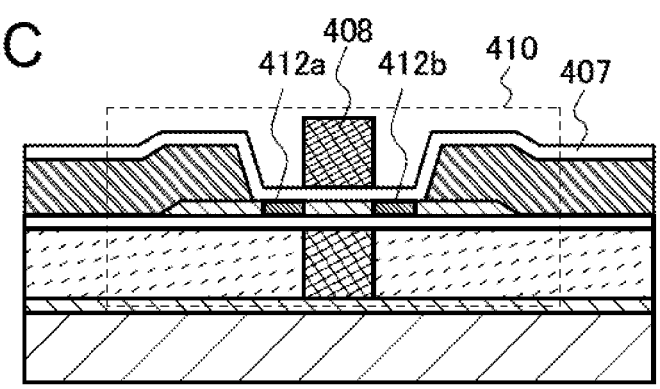

Next, a gate insulating film 407 is formed over the oxide semiconductor film 405, the source electrode layer 406a, and the drain electrode layer 406b (see FIG. 8C). The gate insulating film 407 functions as a first gate insulating film.

A formation method and a material of the gate insulating film 407 are similar to those of the gate insulating film 404, and accordingly, the detailed explanation therefor is omitted here. The thickness of the gate insulating film 407 ranges from 1 nm to 500 nm, preferably from 10 nm to 300 nm.

Like the gate insulating film 404, the gate insulating film 407 may be subjected to heat treatment or treatment for adding oxygen.

Next, a conductive layer for forming a gate electrode layer (including a wiring formed in the same layer as the gate electrode layer) is formed in a region over the gate insulating film 407 to overlap the gate electrode layer 402 and the oxide semiconductor film 405, and the conductive film is processed to form a gate electrode layer 408 (see FIG. 8C). The gate electrode layer 408 functions as the first gate electrode.

A formation method and a material of the gate electrode layer 408 are similar to those of the gate electrode layer 402, and accordingly, the detailed explanation therefor is omitted here.

Then, treatment for adding a dopant is performed on the oxide semiconductor film 405 through the gate insulating film 407 with the use of the gate electrode layer 408 as a mask, thereby forming regions 412a and 412b containing the dopant.

The dopant added to the oxide semiconductor film 405 is selected from at least one of a Group 15 element such as nitrogen, phosphorus, or boron; a rare gas element such as helium, neon, argon, krypton, or xenon; and hydrogen. The dopant can be added by ion doping or ion implantation. By using ion doping or ion implantation, the depth to which the dopant is added (a region to which the dopant is added) can be easily controlled, and thus the dopant can be added with high accuracy. The substrate may be heated while the dopant is added by ion doping or ion implantation.

Further, the dopant can be added by a method other than ion doping and ion implantation. For example, the dopant can be added in the following manner: plasma is generated in an atmosphere of a gas containing an element to be added and plasma treatment is performed on an object to which the dopant is added. As an apparatus for plasma treatment, a dry etching apparatus, a plasma CVD apparatus, a high-density plasma CVD apparatus, or the like can be used. In this case, when crystal parts are included in a region of the oxide semiconductor film to which the dopant is added, the crystallinity might be decreased because of damage due to the addition of the dopant, and the region might become an amorphous region as a result.

The addition of the dopant is controlled by appropriately setting the implantation conditions such as the accelerated voltage and the dosage, or the thickness of the films through which the dopant passes. In this embodiment, boron is used as the dopant and boron ions are added by ion implantation. The dosage of the dopant can range from $1\times10^{13}$ ions/cm² to $5\times10^{16}$ ions/cm².

With the addition of the dopant to the oxide semiconductor film 405, the concentration of the dopant in the regions 412a and 412b containing the dopant preferably ranges from $5\times10^{18}$/cm$^3$ to $1\times10^{22}$/cm$^3$.

The introduction of the dopant into the oxide semiconductor film 405 may be performed plural times, and the number of kinds of dopants may be plural.

In addition, heat treatment may be performed after the dopant is added. The heat treatment is preferably performed at a temperature ranging from 300° C. to 700° C., preferably from 300° C. to 450° C. for 1 hour in an oxygen atmosphere. The heat treatment may be performed under a nitrogen atmosphere, reduced pressure, or the air (ultra-dry air).

Through the above steps, the transistor 410 can be formed (see FIG. 8C).

Figure 8D:
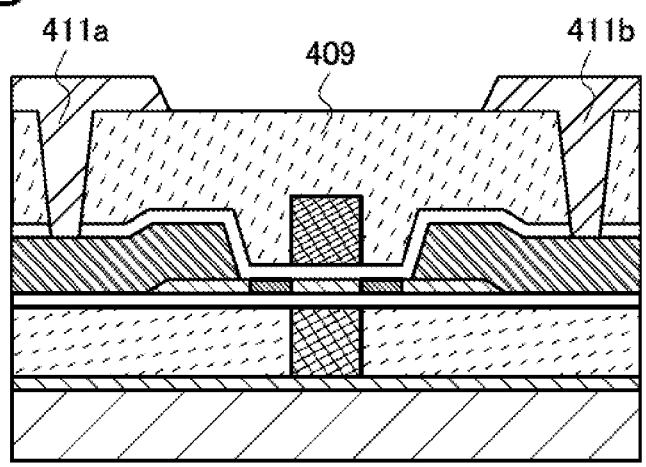

Next, an insulating film 409 serving as an interlayer insulating film (a protective insulating film and/or a planarization insulating film) is formed over the gate insulating film 407 and the gate electrode layer 408 (see FIG. 8D).

The protective insulating film can be formed using a material and a method similar to those of the insulating film 403. For example, the protective insulating film can be an aluminum oxide film or a silicon oxynitride film formed by sputtering. Moreover, heat treatment may be performed after formation of the protective insulating film. For example, heat treatment is performed at 300° C. for 1 hour in a nitrogen atmosphere.

Providing the planarization insulating film can reduce surface unevenness due to the transistor. For the planarization insulating film, an organic material such as a polyimide resin, an acrylic resin, or a benzocyclobutene resin can be used. Other than such organic materials, it is also possible to use a low-dielectric constant material (a low-k material) or the like. Note that the planarization insulating film may be formed by stacking a plurality of insulating films formed from these materials. For example, a 1.5-μm-thick acrylic resin film is formed as the planarization insulating film. The acrylic resin film can be formed in such a manner that an acrylic resin is applied by a coating method and then baked (e.g., at 250° C. for 1 hour in a nitrogen atmosphere).

Heat treatment may be performed after the insulating film 409 is formed. For example, heat treatment is performed at 250° C. for 1 hour in a nitrogen atmosphere. The heat treatment may be performed more than once.

Next, in a photolithography process, a resist mask is formed over the insulating film 409, and the insulating film 409 and the gate insulating film 407 are selectively etched to form openings in the insulating film 409 and the gate insulating film 407.

Then, a conductive film that is to be a source wiring layer and a drain wiring layer is formed over the insulating film 409, and the conductive film is processed to form a source wiring layer 411a and a drain wiring layer 411b that are connected to the source electrode layer 406a and the drain electrode layer 406b (see FIG. 8D).

A formation method and a material of the conductive film to be the source wiring layer 411a and the drain wiring layer 411b are similar to those of the conductive film to be the source electrode layer 406a and the drain electrode layer 406b, and accordingly, the detailed explanation therefor is omitted here.

In the transistor according to this embodiment, the oxide semiconductor film 405 is highly purified by reduction in impurities and reduction in oxygen vacancies. The highly purified oxide semiconductor (purified OS) is an intrinsic (i-type) semiconductor or a substantially i-type semiconductor. For this reason, with the use of the above oxide semiconductor for a channel formation region, the off-state current of the transistor can be extremely low and negative shift of the threshold voltage can be suppressed (i.e., the transistor easily obtains normally-off characteristics).

Specifically, the concentration of hydrogen in the oxide semiconductor film 405 that is measured by secondary ion mass spectrometry (SIMS) is preferably less than $5\times10^{18}$/cm$^3$, more preferably less than or equal to $5\times10^{17}$/cm$^3$, still more preferably less than or equal to $1\times10^{16}$/cm$^3$. The carrier density of the oxide semiconductor film that can be measured by Hall effect measurement is preferably lower than $1\times10^{14}$/cm$^3$, more preferably lower than $1\times10^{12}$/cm$^3$, still more preferably lower than $1\times10^{11}$/cm$^3$. The band gap of the oxide semiconductor is 2 eV or more, preferably 2.5 eV or more, more preferably 3 eV or more. The oxide semiconductor that is highly purified by sufficient reduction in impurity concentration and reduction in oxygen vacancies is used for a channel formation region, whereby the off-state current of the transistor can be reduced and negative shift of the threshold voltage can be suppressed (i.e., normally-off characteristics can be obtained).

The off-state current per micrometer of channel width of the transistor including the above oxide semiconductor in its channel formation region can be reduced to 100 yA ($1\times10^{-22}$ A) or less, preferably 10 yA ($1\times10^{-23}$ A) or less, further preferably 1 yA ($1\times10^{-24}$ A) or less. Note that in this specification and the like, the off-state current is a current that flows between a source and a drain when a transistor is off. In an n-channel transistor (e.g., with a threshold voltage of about 0 to 2 V), the off-state current is a current that flows between a source and a drain when a negative voltage is applied between a gate and the source.

Since impurities and oxygen vacancies have been reduced in the oxide semiconductor film 405, generation of carriers can be suppressed. Suppressing the increase in carrier density can suppress negative shift of the threshold voltage of the transistor due to the carrier density. As a result, the threshold voltage of the transistor can be easily controlled by a potential applied to the second gate electrode of the transistor.

In the case where the first gate insulating film and the second gate insulating film are formed using the same material, the amount of shift of the threshold voltage of the transistor can be controlled by the thickness ratio of the gate insulating films. When the thickness ratio of the first gate insulating film to the second gate insulating film is 1:10, the amount of shift of the threshold voltage of the transistor tends to increase as compared to the case where the thickness ratio is 1:1.

The inverter circuit INV according to Embodiments 1 and 2 is configured using such a transistor, whereby the threshold voltage of the transistor can be easily controlled by a potential applied to the second gate electrode of the transistor.

Configuring a ring oscillator by using the inverter circuit INV according to Embodiments 1 and 2 can increase the oscillation frequency of the ring oscillator. Thus, the delay time of the inverter circuit INV can be shortened. Moreover, the amplitude of the output signal of the inverter circuit INV can be enhanced with the use of the above transistor having low off-state current.

The transistor including the above-described oxide semiconductor may be stacked over a transistor including silicon or the like.

(Embodiment 4)

In this embodiment, a phase locked loop (PLL) including the ring oscillator according to one embodiment of the present invention will be described. A phase locked loop has a function of generating a periodic signal synchronized with a periodic signal input from the outside and a function of generating a periodic signal whose cycle is n times that of a periodic signal input from the outside.

Figure 9:
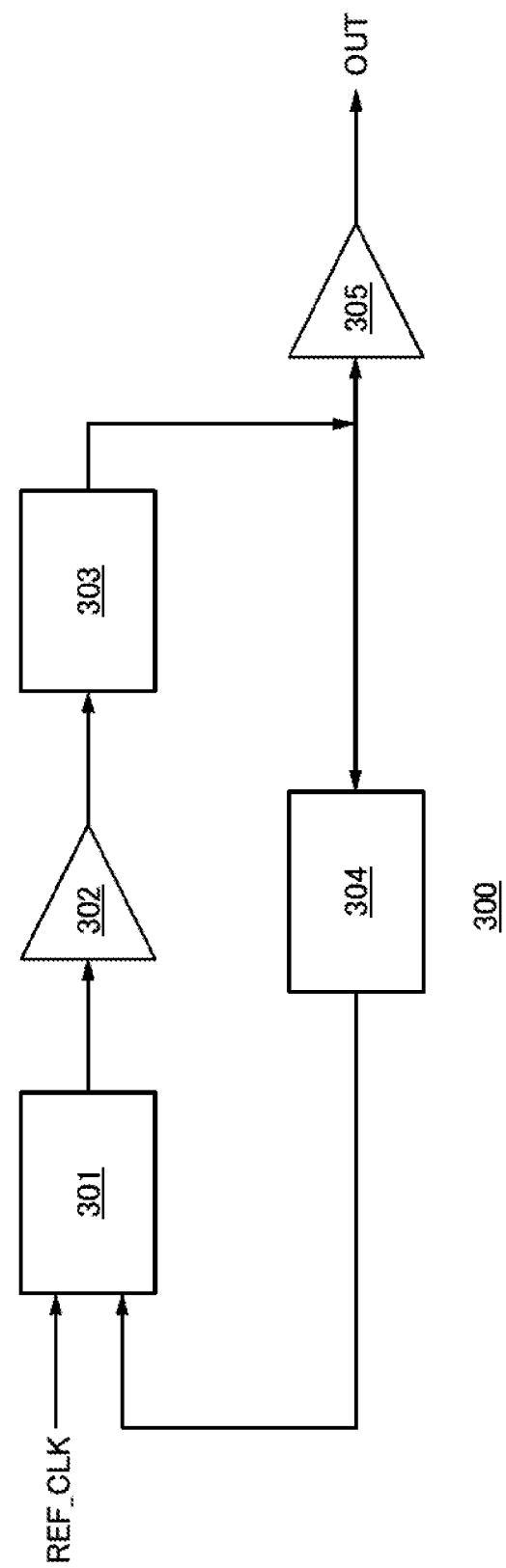
FIG. 9 is a block diagram illustrating an oscillator circuit.

FIG. 9 is a block diagram illustrating a phase locked loop according to this embodiment.

A phase locked loop 300 includes a phase frequency detector (PFD) 301, a loop filter (LPF) 302, a voltage controlled oscillator (VCO) 303, a frequency divider 304, and a buffer 305. A charge pump may be provided between the phase frequency detector 301 and the loop filter 302.

To the phase frequency detector 301, the following two periodic signals are input: a periodic signal (REF_CLK) input from the outside, and a periodic signal generated by dividing an output signal from the voltage controlled oscillator 303 by the frequency divider 304. The phase frequency detector 301 outputs a signal based on the phase difference between the two periodic signals (also referred to as a phase difference signal).

The phase difference signal output from the phase frequency detector 301 is converted into a voltage signal by the loop filter 302. Then, the voltage signal is input to the voltage controlled oscillator 303.

The ring oscillator according to one embodiment of the present invention is used as the voltage controlled oscillator 303, so that the voltage signal converted by the loop filter 302 is input to the ring oscillator. The ring oscillator oscillates the frequency corresponding to the inputted voltage signal, and outputs the generated signal as a periodic signal to the frequency divider 304 and the buffer 305.

The phase locked loop 300 as a whole is a feedback control system. The above operations are continuously repeated, and when the phase difference between the periodic signal input to the phase frequency detector 301 from the outside and the periodic signal input to the phase frequency detector 301 from the frequency divider 304 becomes zero, the phase locked loop 300 is locked. That is, the voltage signal input to the voltage controlled oscillator 303 is constant (becomes a stable voltage), and thus, the cycle (frequency) of the periodic signal output from the voltage controlled oscillator 303 becomes constant.

With the use of the ring oscillator according to one embodiment of the present invention as the voltage controlled oscillator 303, the rise time and the fall time of the periodic signal are short, resulting in increase in the oscillation frequency. Moreover, periodic signals output from the voltage controlled oscillator 303 can have a wider range of frequencies. In addition, lower power consumption can be achieved.

Next, the description is made on examples where a semiconductor device including the phase locked loop 300 according to one embodiment of the present invention is applied to a portable electronic device such as a mobile phone, a smartphone, or an e-book reader.

Figure 10:
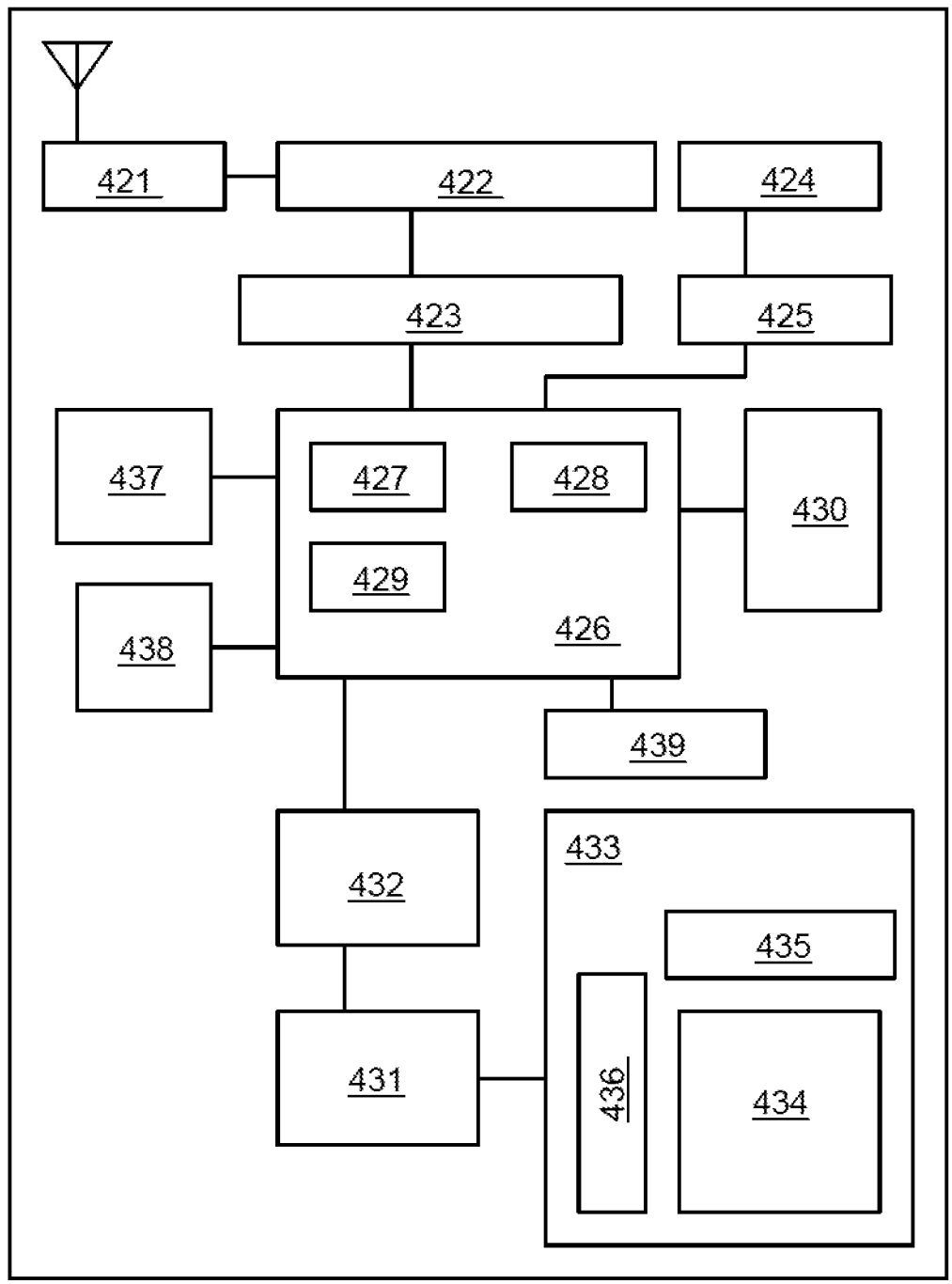
FIG. 10 is a block diagram of a portable electronic device.

FIG. 10 is a block diagram of a portable electronic device. The portable electronic device illustrated in FIG. 10 includes an RF circuit 421, an analog baseband circuit 422, a digital baseband circuit 423, a battery 424, a power supply circuit 425, an application processor 426, a flash memory 430, a display controller 431, a memory circuit 432, a display 433, a touch sensor 439, an audio circuit 437, a keyboard 438, and the like. The display 433 includes a display portion 434, a source driver 435, and a gate driver 436. The application processor 426 includes a CPU 427, a DSP 428, and an interface 429.

The phase locked loop according to one embodiment of the present invention can be used for an internal clock generator circuit applied to the CPU 427 or the like, a frequency synthesizer such as the RF circuit 421, and an FM signal demodulator such as the digital baseband circuit 423. By using the phase locked loop according to one embodiment of the present invention to generate an internal clock for the CPU 427 or the like, a stable synchronous clock can be generated. Further, a high frequency can be generated, so that the CPU 427 can operate at high speed.

Figure 11:
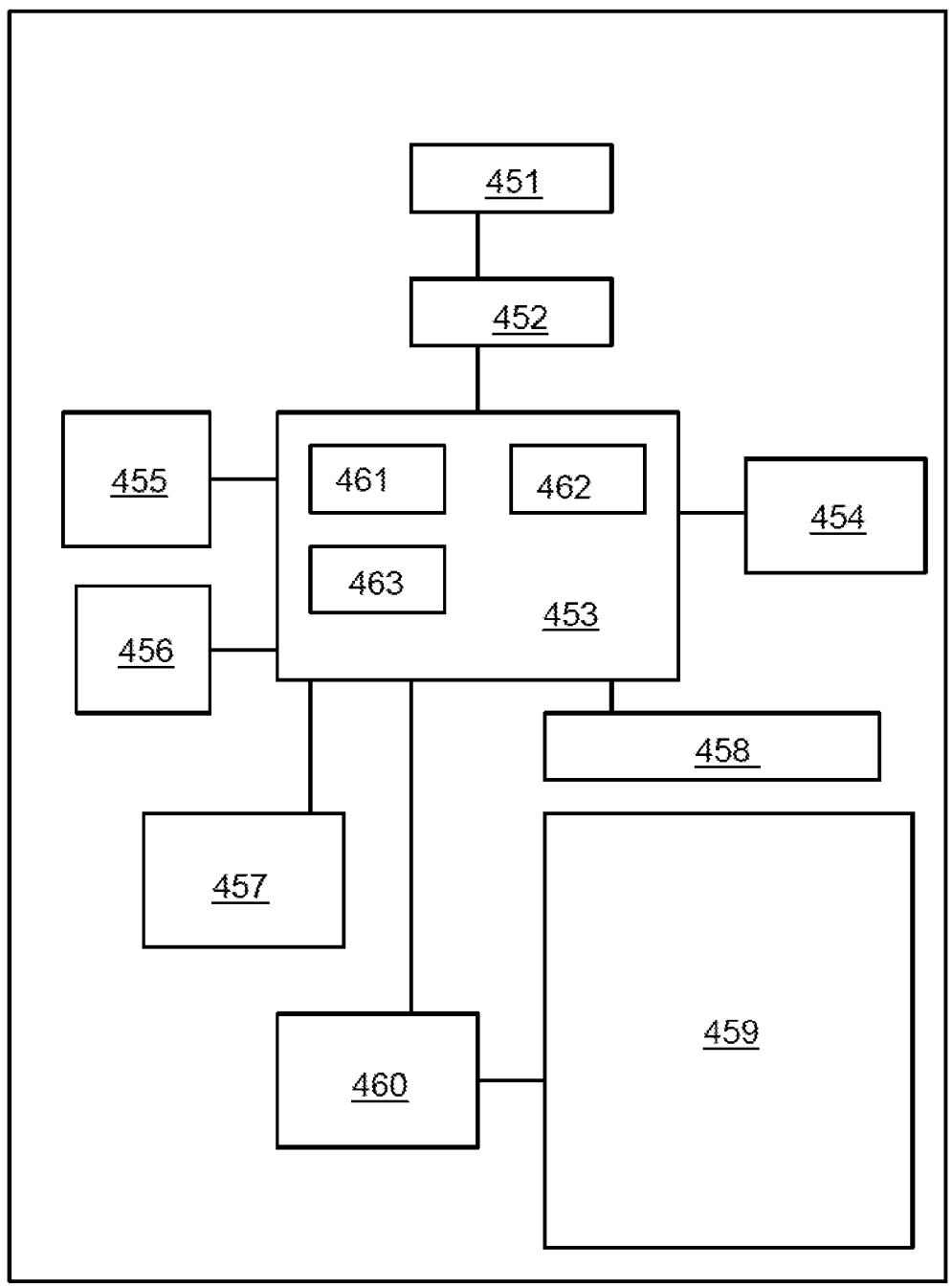
FIG. 11 is a block diagram of an e-book reader.

FIG. 11 is a block diagram of an e-book reader. The e-book reader includes a battery 451, a power supply circuit 452, a microprocessor 453, a flash memory 454, an audio circuit 455, a keyboard 456, a memory circuit 457, a touch panel 458, a display 459, and a display controller 460. The microprocessor 453 includes a CPU 461, a DSP 462, and an interface 463.

The phase locked loop according to one embodiment of the present invention can be used for an internal clock generator circuit applied to the CPU 461, for example. By using the phase locked loop according to one embodiment of the present invention for the CPU 461 or the like to generate an internal clock, a stable synchronous clock can be generated. Further, a high frequency can be generated, so that the CPU 461 can operate at high speed.

This embodiment can be implemented in combination with any of the above embodiments as appropriate.

Example 1

In this example, the results of evaluating the electrical characteristics of transistors will be described.

Methods for fabricating transistors used for evaluation under two different conditions will be described with reference to Embodiment 3. In a transistor fabricated under the first condition (hereinafter referred to as first transistor), the thickness ratio of the first gate insulating film to the second gate insulating film is 1:1 (the thickness of the first gate insulating film is 100 nm and that of the second gate insulating film is 100 nm). In a transistor fabricated under the second condition (hereinafter referred to as second transistor), the thickness ratio of the first gate insulating film to the second gate insulating film is 1:10 (the thickness of the first gate insulating film is 30 nm and that of the second gate insulating film is 300 nm).

First, the method for fabricating the first transistor is described.

A silicon wafer was used as the substrate 400. Thermal oxidation treatment was performed on the silicon wafer, so that a 100-nm-thick silicon oxide film was formed on the silicon wafer as the insulating film 401. The silicon oxide film was formed by thermal oxidation treatment at 950° C. for 3 hours in an atmosphere containing HCl at 3 vol % with respect to oxygen.

Then, a 100-nm-thick tungsten film was formed over the insulating film 401. The tungsten film was deposited by sputtering with an argon gas flow rate of 90 sccm, a pressure of 0.8 Pa, and a supply power of 1 kW at 230° C. Next, in a photolithography process, a resist mask was formed over the tungsten film and the tungsten film was selectively etched, thereby forming the gate electrode layer 402. After that, the resist mask was removed.

Next, a 200-nm-thick silicon oxide film was formed as the insulating film 403 over the insulating film 401 and the gate electrode layer 402. The silicon oxide film was deposited by sputtering with an oxygen gas flow rate of 50 sccm, a pressure of 0.4 Pa, a supply power of 1.5 kW, and a target to substrate (T-S) distance of 60 mm at a substrate temperature of 100° C.

Then, CMP treatment was performed on the insulating film 403 until an upper surface of the gate electrode layer 402 was exposed.

Next, a 100-nm-thick silicon oxide film was formed as the gate insulating film 404 over the insulating film 403 and the gate electrode layer 402. The silicon oxide film was deposited with an oxygen gas flow rate of 50 sccm, a pressure of 0.4 Pa, a supply power of 1.5 kW, and a T-S distance of 60 mm at a substrate temperature of 100° C.

Subsequently, after the gate insulating film 404 was deposited, a 20-nm-thick IGZO film was formed as the oxide semiconductor film 405 by sputtering using an oxide target containing In, Ga, and Zn in an atomic ratio of 3:1:2 without exposing the gate insulating film 404 to the air. The IGZO film was deposited in an atmosphere containing argon and oxygen (argon/oxygen=30 sccm/10 sccm) with a pressure of 0.4 Pa and a supply power of 0.5 kW at a substrate temperature of 200° C.

Next, in a photolithography process, a resist mask was formed over the oxide semiconductor film 405 and the oxide semiconductor film 405 was selectively etched, so that the island-shaped oxide semiconductor film 405 was formed. After that, the resist mask was removed.

Then, a 50-nm-thick tungsten film was formed by sputtering over the island-shaped oxide semiconductor film 405. The tungsten film was deposited by sputtering with an argon gas flow rate of 90 sccm, a pressure of 0.8 Pa, and a supply power of 1 kW at 230° C. Next, in a photolithography process, a resist mask was formed over the tungsten film and the tungsten film was selectively etched, thereby forming the source electrode layer 406a and the drain electrode layer 406b.

Next, a 100-nm-thick silicon oxide film was formed as the gate insulating film 407 over the oxide semiconductor film 405, the source electrode layer 406a, and the drain electrode layer 406b. The silicon oxide film was formed with an oxygen gas flow rate of 50 sccm, a pressure of 0.4 Pa, a supply power of 1.5 kW, and a T-S distance of 60 mm at a substrate temperature of 100° C.

Then, treatment for adding oxygen was performed on the gate insulating film 407 and the oxide semiconductor film 405. The oxygen addition treatment was performed by ion implantation with an accelerated voltage of 25 kV and a dosage of $1.0 \times 10^{16}$ cm$^{-2}$.

Next, a 30-nm-thick tantalum nitride film and a 135-nm-thick tungsten film were formed over the gate insulating film 407 in a region overlapping the gate electrode layer 402 and the oxide semiconductor film 405. The tantalum nitride film was deposited by sputtering in an atmosphere containing argon and nitrogen (argon/nitrogen=50 sccm/10 sccm) with a pressure of 0.6 Pa and a supply power of 1.0 kW. The tungsten film was deposited by sputtering with an argon gas flow rate of 110 sccm, a pressure of 2.0 Pa, and a supply power of 4 kW at 230° C. Then, in a photolithography process, a resist mask was formed over the tungsten film, and the tungsten film and the tantalum nitride film were selectively etched to form the gate electrode layer 408.

Then, boron was added to the oxide semiconductor film 405 through the gate insulating film 407 with the use of the gate electrode layer 408 as a mask. The boron addition treatment was performed by ion implantation with an accelerated voltage of 30 kV and a dosage of $3.0 \times 10^{15}$ cm$^2$.

Next, a 50-nm-thick aluminum oxide film and a 300-nm-thick silicon oxynitride film were formed as the insulating film 409 over the gate insulating film 407 and the gate electrode layer 408. The aluminum oxide film was deposited by sputtering in an atmosphere containing argon and oxygen (argon/oxygen=25 sccm/25 sccm) with a pressure of 0.4 Pa, a supply power of 2.5 kW, and a T-S distance of 60 mm at a substrate temperature of 250° C. The silicon oxynitride film was deposited by CVD.

Then, in a photolithography process, a resist mask was formed over the silicon oxynitride film, and the silicon oxynitride film, the aluminum oxide film, and the silicon oxide film were selectively etched to form openings in the silicon oxynitride film, the aluminum oxide film, and the silicon oxide film.

Subsequently, a 50-nm-thick titanium film, a 100-nm-thick aluminum film, and a 50-nm-thick titanium film were formed over the silicon oxynitride film. The titanium films were deposited by sputtering with an argon gas flow rate of 20 sccm, a pressure of 0.1 Pa, and a supply power of 12 kW at room temperature. The aluminum film was deposited by sputtering with an argon gas flow rate of 50 sccm, a pressure of 0.4 Pa, and a supply power of 1 kW at room temperature. Then, in a photolithography process, a resist mask was formed over the titanium film, and the titanium film, the aluminum film, and the titanium film were selectively etched, thereby forming the source wiring layer 411a and the drain wiring layer 411b connected to the source electrode layer 406a and the drain electrode layer 406b.

Finally, heat treatment was performed, so that the first transistor was completed.

Next, the method for fabricating the second transistor is described.

The second transistor is the same as the first transistor except for the thickness of the gate insulating film 404 (the second gate insulating film) and the gate insulating film 407 (the first gate insulating film). Therefore, fabrication steps different from those of the first transistor will be specifically explained, and the detailed description of the other steps will be omitted.

As in the first transistor, the insulating film 401, the gate electrode layer 402, and the insulating film 403 were formed over the substrate 400, and after that, CMP treatment was performed on the insulating film 403 until an upper surface of the gate electrode layer 402 was exposed.

Next, a 300-nm-thick silicon oxide film was formed as the gate insulating film 404 over the insulating film 403 and the gate electrode layer 402. The silicon oxide film was deposited with an oxygen gas flow rate of 50 sccm, a pressure of 0.4 Pa, a supply power of 1.5 kW, and a T-S distance of 60 mm at a substrate temperature of 100° C.

Then, after the gate insulating film 404 was deposited, the oxide semiconductor film 405 was formed without exposing the gate insulating film 404 to the air, and then the island-shaped oxide semiconductor film 405 was formed.

Subsequently, the source electrode layer 406a and the drain electrode layer 406b were formed over the island-shaped oxide semiconductor film 405.

Next, a 30-nm-thick silicon oxide film was formed as the gate insulating film 407 over the oxide semiconductor film 405, the source electrode layer 406a, and the drain electrode layer 406b. The silicon oxide film was formed with an oxygen gas flow rate of 50 sccm, a pressure of 0.4 Pa, a supply power of 1.5 kW, and a T-S distance of 60 mm at a substrate temperature of 100° C.

Then, treatment for adding oxygen was performed on the gate insulating film 407 and the oxide semiconductor film 405. The oxygen addition treatment was performed by ion implantation with an accelerated voltage of 10 kV and a dosage of $5.0 \times 10^{15}$ cm$^{-2}$.

Next, the gate electrode layer 408 was formed over the gate insulating film 407 in a region overlapping the gate electrode layer 402 and the oxide semiconductor film 405.

Then, boron was added to the oxide semiconductor film 405 through the gate insulating film 407 with the use of the gate electrode layer 408 as a mask. The boron addition treatment was performed by ion implantation with an accelerated voltage of 30 kV and a dosage of $3.0 \times 10^{15}$ cm$^{-2}$.

Subsequently, the insulating film 409 was formed over the gate insulating film 407 and the gate electrode layer 408, and after that, openings were formed in the insulating film 409. Then, the source wiring layer 411a and the drain wiring layer 411b connected to the source electrode layer 406a and the drain electrode layer 406b were formed.

Finally, heat treatment was performed, so that the second transistor was completed.

Next, the drain current ID vs. gate voltage VG characteristics, which are one kind of electrical characteristics of transistors, were measured using the first and second transistors. The drain currents ID [A] of the first and second transistors were measured when the drain voltage VD was 10 V and the first gate voltage VG swept between −10 V and +10 V. For the first transistor, the second gate voltage VBG varied by 2 V from −10 V to +10 V. For the second transistor, the second gate voltage VBG varied by 5 V from −15 V to +15 V.

Figure 12A:
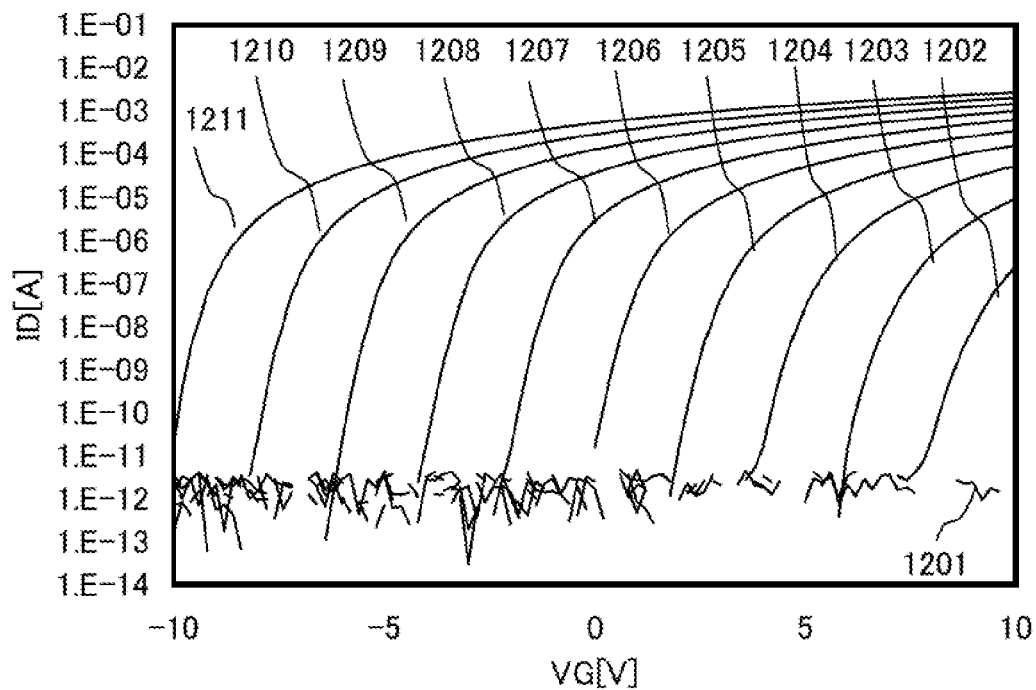
FIGS. 12A and 12B show VG-ID characteristics of transistors fabricated in Example 1.
Figure 12B:
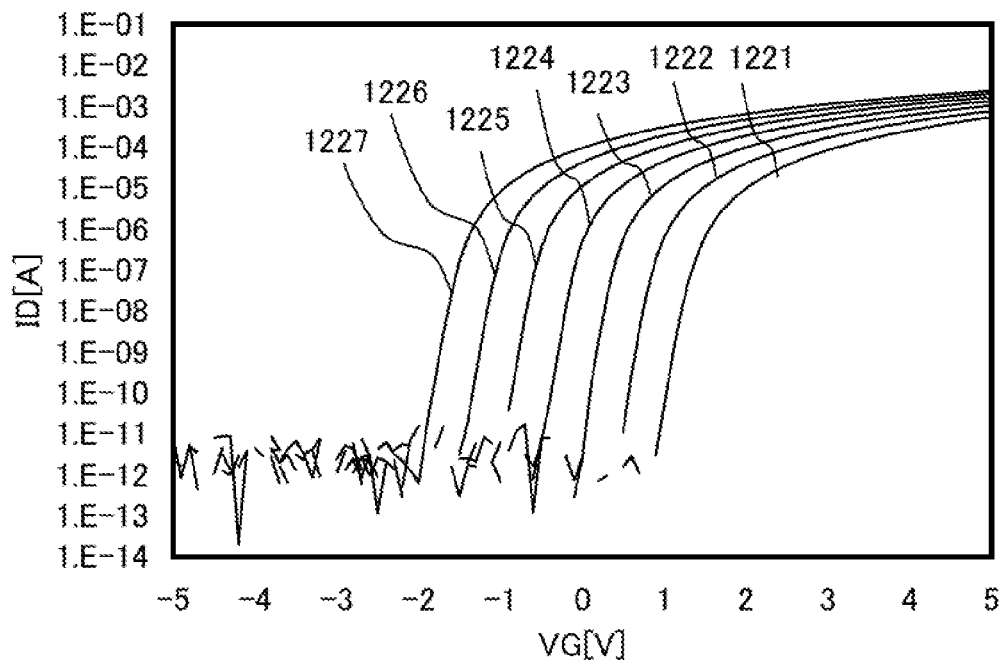

FIG. 12A shows VG-ID curves of the first transistor. FIG. 12B shows VG-ID curves of the second transistor. The horizontal axis represents the first gate voltage VG [V], and the vertical axis represents the drain current ID [A]. Note that the first and second transistors had a channel length L of 3 μm and a channel width W of 200 μm.

In FIG. 12A, each solid line represents a drain current ID with a corresponding voltage VBG being applied to the second gate electrode as follows: a solid line 1201, −10 V; a solid line 1202, −8 V; a solid line 1203, −6 V; a solid line 1204, −4 V; a solid line 1205, −2 V; a solid line 1206, no voltage application (i.e., 0 V); a solid line 1207, 2 V; a solid line 1208, 4 V; a solid line 1209, 6 V; a solid line 1210, 8 V; and a solid line 1211, 10 V.

In FIG. 12B, each solid line represents a drain current ID with a corresponding voltage VBG being applied to the second gate electrode as follows: a solid line 1221, −15 V; a solid line 1222, −10 V; a solid line 1223, −5 V; a solid line 1224, no voltage application (i.e., 0 V); a solid line 1225, 5 V; a solid line 1226, 10 V; and a solid line 1227, 15 V.

As shown in FIG. 12A, the threshold voltage of the first transistor varied by about 2 V each time the voltage VBG applied to the second gate electrode was changed by 2 V. Moreover, as shown in FIG. 12B, the threshold voltage of the second transistor varied by about 0.5 V each time the voltage VBG applied to the second gate electrode was changed by 5 V. In other words, the amount of variation in the threshold voltage due to the voltage VBG applied to the second gate electrode was smaller in the second transistor than in the first transistor. In addition, as shown in FIGS. 12A and 12B, the off-state currents of the first and second transistors were below the measurement limit ($1 \times 10^{-13}$ A) of a semiconductor parameter analyzer, and thus could not be estimated accurately.

It was found from the results shown in FIGS. 12A and 12B that the amount of variation in the threshold voltage differs depending on the thickness ratio of the first gate insulating film to the second gate insulating film.

As seen from the results shown in FIGS. 12A and 12B, the amount of variation in the threshold voltage of the transistor can be controlled by the thickness ratio of the first gate insulating film to the second gate insulating film. Consequently, by using such a transistor to form the ring oscillator according to one embodiment of the present invention, the ring oscillator can have excellent properties.

Example 2

Next, the description is made on the results of evaluating the amplitude and frequency of a ring oscillator formed using the second transistor shown in Example 1.

First, the ring oscillator formed in this example will be described.

Figure 13A:
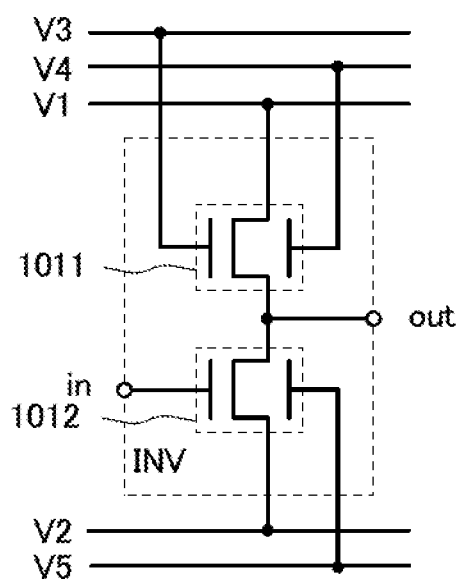
FIGS. 13A and 13B illustrate inverter circuits fabricated in Example 2.

In the ring oscillator formed in this example, the inverter circuit INV illustrated in FIG. 13A was used as an inverter circuit and seven inverter circuits INV were connected in a ring shape.

Figure 14A:
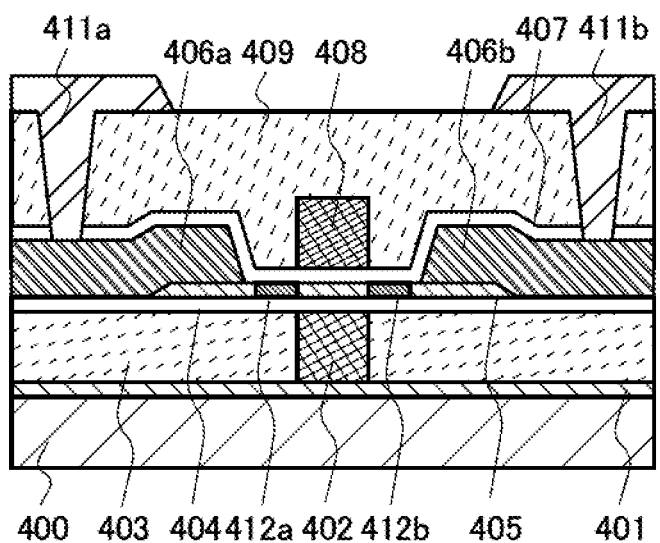
FIGS. 14A and 14B illustrate transistors fabricated in Example 2.

In FIG. 13A, a transistor 1011 and a transistor 1012 were formed to have a structure illustrated in FIG. 14A and satisfy the second condition shown in Example 1 (the thickness ratio of the first gate insulating film to the second gate insulating film is 1:10). Note that the channel length L of both of the transistors 1011 and 1012 was 3 μm; the channel width W of the transistor 1011 was 20 μm and that of the transistor 1012 was 200 μm.

Next, a ring oscillator formed as a comparative example will be described.

Figure 13B:
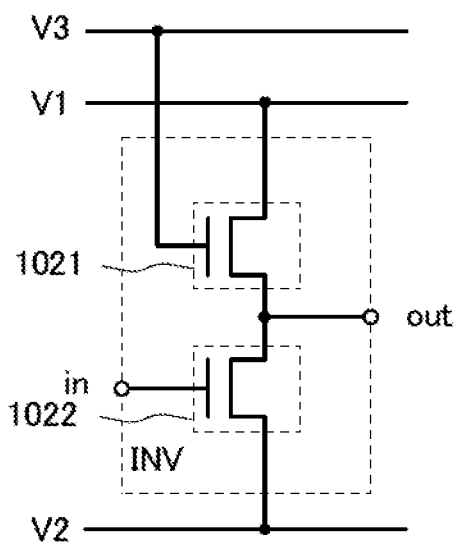

In the ring oscillator formed as the comparative example, an inverter circuit INV illustrated in FIG. 13B was used as an inverter circuit and seven inverter circuits INV were connected in a ring shape.

Figure 14B:
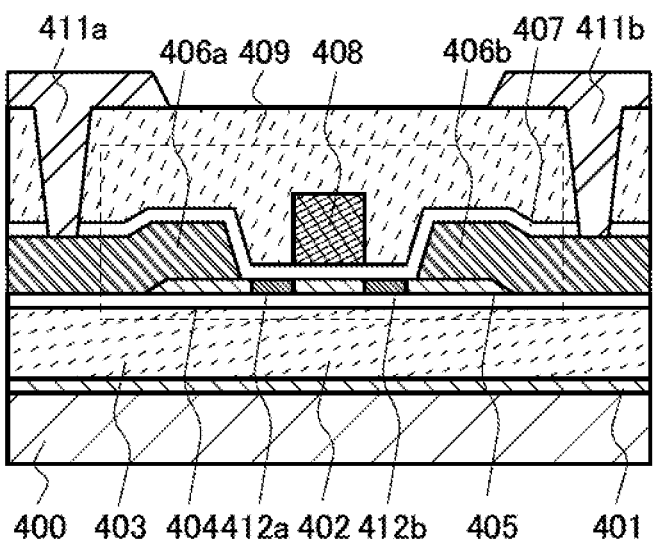

In FIG. 13B, a transistor 1021 and a transistor 1022 were formed to have a structure illustrated in FIG. 14B and satisfy the second condition shown in Example 1 except that the second gate electrode layer was not formed. Note that the channel length L of both of the transistors 1021 and 1022 was 3 μm; the channel width W of the transistor 1021 was 20 μm and that of the transistor 1022 was 200 μm.

Next, the amplitude and frequency of the ring oscillator formed in this example and the ring oscillator formed as the comparative example were measured. The number of samples (n) for each of the ring oscillators is three.

Figure 15A:
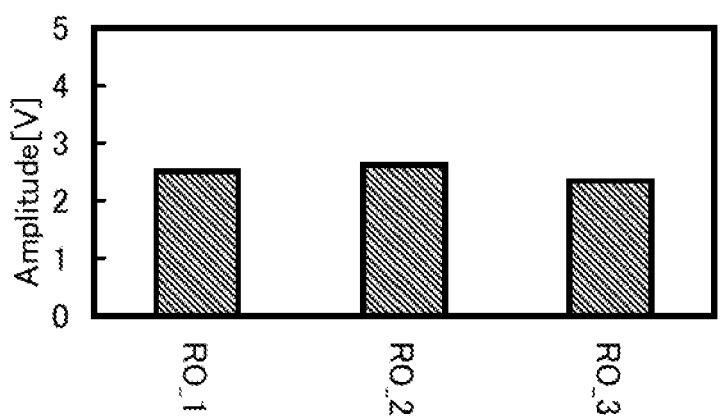
FIGS. 15A and 15B show the amplitude and frequency of ring oscillators according to Example 2.
Figure 15B:
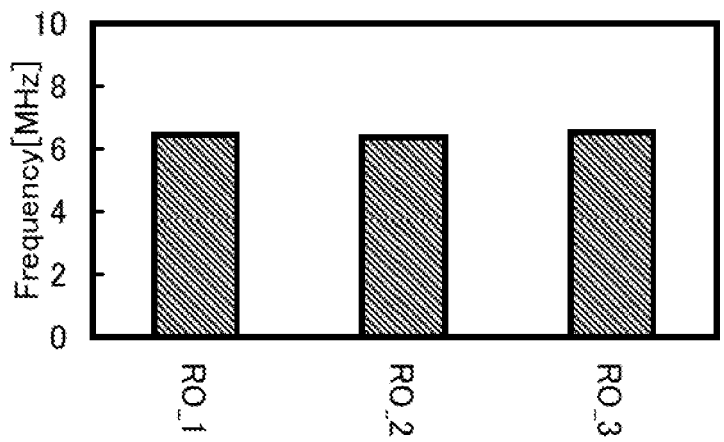
Figure 16A:
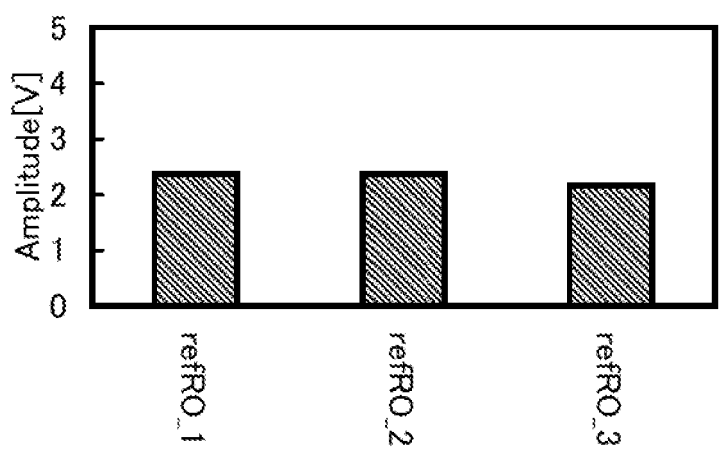
FIGS. 16A and 16B show the amplitude and frequency of ring oscillators of a comparative example.
Figure 16B:
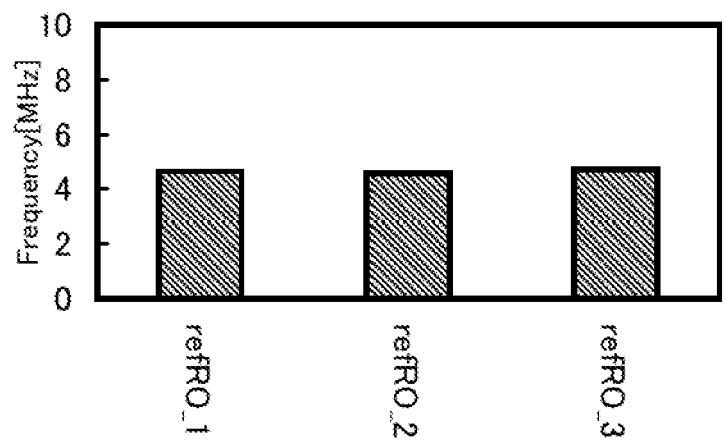

FIGS. 15A and 15B show the amplitude [V] and the frequency [MHz], respectively, of the ring oscillator formed in this example. FIGS. 16A and 16B show the amplitude [V] and the frequency [MHz], respectively, of the ring oscillator formed as the comparative example. Note that RO in FIGS. 15A and 15B denotes the ring oscillator formed in this example, and refRO in FIGS. 16A and 16B denotes the ring oscillator formed as the comparative example.

As shown in FIGS. 15B and 16B, the oscillation frequency of the ring oscillator formed in this example was higher than that of the ring oscillator formed as the comparative example.

The results shown in FIGS. 15A and 15B and FIGS. 16A and 16B showed that providing the second gate electrode in the transistor included in the inverter circuit and controlling the potential of the second gate electrode can increase the oscillation frequency of the ring oscillator. As a result, the delay time of the inverter circuit can be shortened.

Example 3

Next, the description is made on the results of evaluating the amplitude and frequency of a ring oscillator formed using the first transistor shown in Example 1.

First, ring oscillators formed in this example will be described. In this example, six kinds of ring oscillators were formed.

Figure 17A:
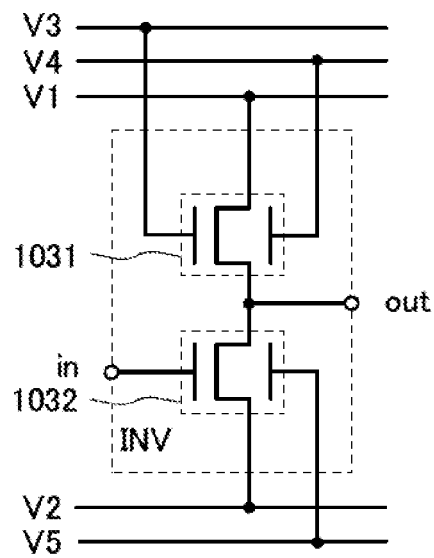
FIGS. 17A and 17B illustrate inverter circuits fabricated in Example 3.

In a ring oscillator A, a ring oscillator B, and a ring oscillator C formed in this example, the inverter circuit INV illustrated in FIG. 17A was used as an inverter circuit and seven inverter circuits INV were connected in a ring shape.

In FIG. 17A, a transistor 1031 and a transistor 1032 were formed to have the structure illustrated in FIG. 14A and satisfy the first condition shown in Example 1 (the thickness ratio of the first gate insulating film to the second gate insulating film is 1:1).

Figure 17B:
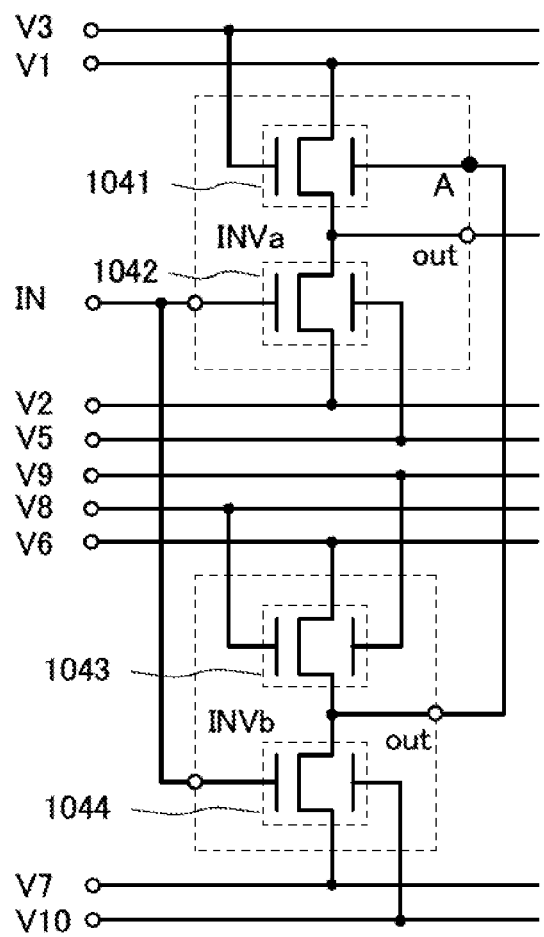

In addition, in a ring oscillator D, a ring oscillator E, and a ring oscillator F formed as comparative examples, the inverter circuit INVa and the control inverter circuit INVb illustrated in FIG. 17B were used as inverter circuits and seven inverter circuits INVa were connected in a ring shape.

In FIG. 17B, transistors 1041 to 1044 were formed to have the structure illustrated in FIG. 14A and satisfy the first condition shown in Example 1.

Table 1 and Table 2 show the channel length L and the channel width W of the transistors 1031 and 1032 in the ring oscillators A, B, and C and the transistors 1041 to 1044 in the ring oscillators D, E, and F.

TABLE 1

|  | Ring oscillator A | | Ring oscillator B | | Ring oscillator C | |
| --- | --- | --- | --- | --- | --- | --- |
|  | Channel width W [μm] | Channel length L [μm] | Channel width W [μm] | Channel length L [μm] | Channel width W [μm] | Channel length L [μm] |
| Transistor 1031 | 20 | 3 | 20 | 1 | 20 | 0.5 |
| Transistor 1032 | 200 | 3 | 200 | 1 | 200 | 0.5 |

TABLE 2

|  | Ring oscillator D | | Ring oscillator E | | Ring oscillator F | |
| --- | --- | --- | --- | --- | --- | --- |
|  | Channel width W [μm] | Channel length L [μm] | Channel width W [μm] | Channel length L [μm] | Channel width W [μm] | Channel length L [μm] |
| Transistor 1041 | 20 | 3 | 20 | 1 | 20 | 0.5 |
| Transistor 1042 | 200 | 3 | 200 | 1 | 200 | 0.5 |
| Transistor 1043 | 20 | 3 | 20 | 1 | 20 | 0.5 |
| Transistor 1044 | 200 | 3 | 200 | 1 | 200 | 0.5 |

Next, the amplitude and frequency of the ring oscillators A to C formed in this example and the ring oscillators D to F formed as the comparative examples were measured. The number of samples (n) for each of the ring oscillators is three.

Figure 18A:
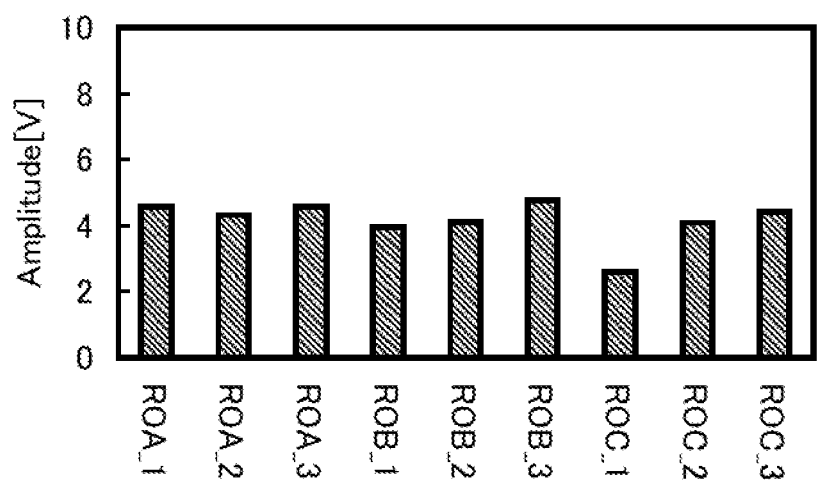
FIGS. 18A and 18B show the amplitude and frequency of ring oscillators A to C.
Figure 18B:
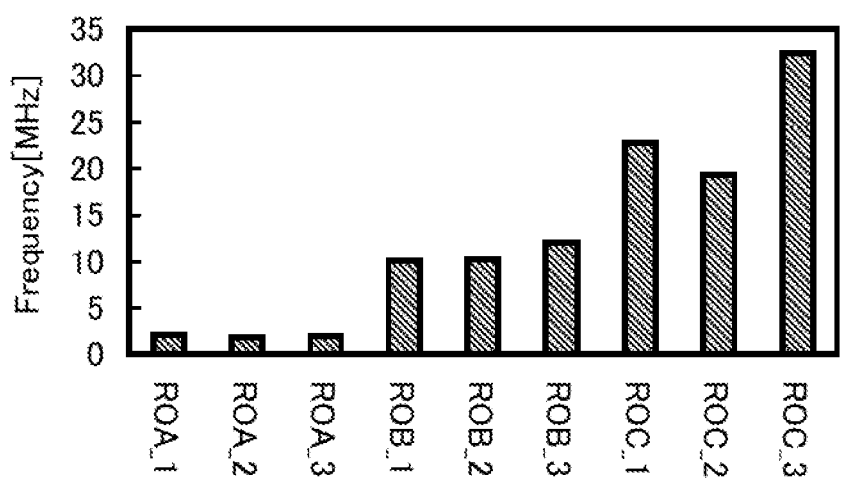
Figure 19A:
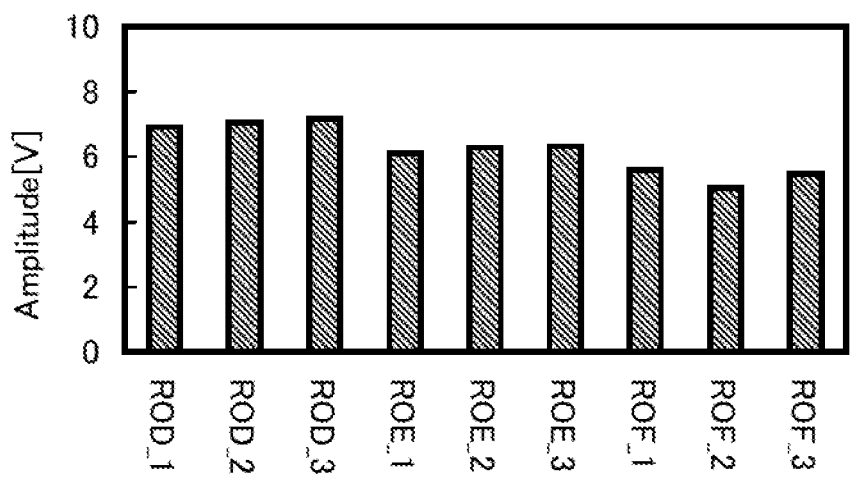
FIGS. 19A and 19B show the amplitude and frequency of ring oscillators D to F.
Figure 19B:
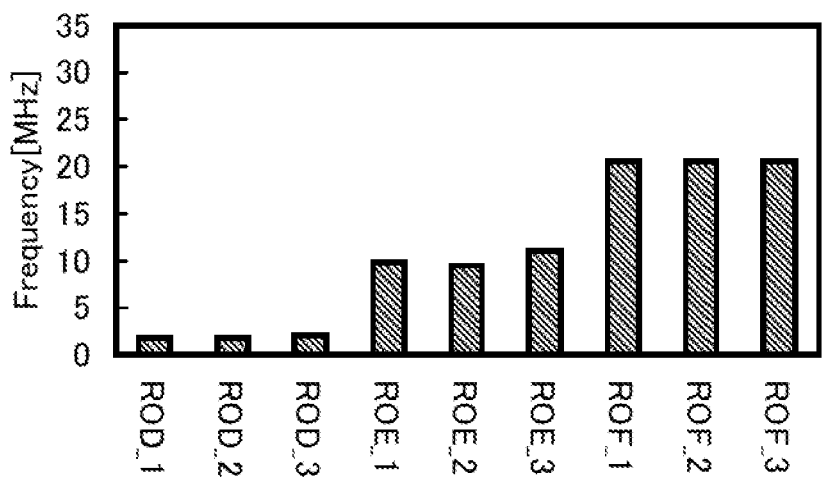

FIGS. 18A and 18B show the amplitude [V] and the frequency [MHz], respectively, of the ring oscillators A to C formed in this example. FIGS. 19A and 19B show the amplitude [V] and the frequency [MHz], respectively, of the ring oscillators D to F formed as the comparative examples. Note that in FIGS. 18A and 18B and FIGS. 19A and 19B, the ring oscillator is abbreviated as RO.

As shown in FIGS. 18A and 19A, the amplitude [V] of the ring oscillators D to F was larger than that of the ring oscillators A to C. Moreover, as shown in FIGS. 18B and 19B, the ring oscillators A to C and the ring oscillators D to F obtained high frequencies.

In the ring oscillators D to F, a second gate electrode of the transistor 1041 in the inverter circuit INVa is supplied with an output signal (a potential) of the control inverter circuit INVb, that is, a potential of opposite polarity to the potential applied to a first gate electrode of the transistor 1042. Thus, the characteristics of the transistor 1041 can be controlled to be normally-on characteristics or normally-off characteristics. Making the transistor 1041 have the normally-off characteristics suppressed the shoot-through current, resulting in enhancement of the amplitude of the ring oscillators D to F.

It was found from the results shown in FIGS. 19A and 19B that the amplitude of the ring oscillator can be increased by input of an inverted signal to the second gate electrode of the transistor 1041 in the inverter circuit INVa. It was also found that the frequency of the ring oscillator can be increased when the second gate electrode is provided in the transistor included in the inverter circuit and the potential of the second gate electrode is controlled.

This application is based on Japanese Patent Applications serial No. 2012-044279 filed with Japan Patent Office on Feb. 29, 2012, the entire contents of which are hereby incorporated by reference.

What is claimed is:

1. A semiconductor device comprising:
   an inverter comprising a first transistor and a second transistor, each of the first transistor and the second transistor comprising:
      an oxide semiconductor film;
      a pair of gate electrodes with the oxide semiconductor film provided therebetween; and
      a source electrode and a drain electrode,
   wherein one of the source electrode and the drain electrode of the first transistor is electrically connected to a first power line,
   wherein one of the source electrode and the drain electrode of the second transistor is electrically connected to a second power line,
   wherein one of the pair of gate electrodes of the first transistor is electrically connected to a third power line,
   wherein one of the pair of gate electrodes of the second transistor is electrically connected to a fourth power line,
   wherein the other of the pair of gate electrodes of the first transistor is electrically connected to the other of the source electrode and the drain electrode of the first transistor, the other of the source electrode and the drain electrode of the second transistor, and an output terminal,
   wherein the other of the pair of gate electrodes of the second transistor is electrically connected to an input terminal,
   wherein a potential of the first power line is higher than a potential of the second power line,
   wherein a potential of the third power line is the same as or higher than the potential of the first power line, and
   wherein a potential of the fourth power line is the same as or lower than the potential of the second power line.

2. The semiconductor device according to claim 1, wherein a ratio of channel width to channel length of the first transistor is lower than a ratio of channel width to channel length of the second transistor.

3. The semiconductor device according to claim 1, wherein the first transistor and the second transistor have the same conductivity type.

4. The semiconductor device according to claim 1, wherein the oxide semiconductor film comprises In, Ga, Zn and oxygen.

5. A ring oscillator comprising the semiconductor device according to claim 1.

6. A semiconductor device comprising:
   an inverter comprising a first transistor and a second transistor, each of the first transistor and the second transistor comprising:
      an oxide semiconductor film;
      a pair of gate electrodes with the oxide semiconductor film provided therebetween; and
      a source electrode and a drain electrode, wherein one of the source electrode and the drain electrode of the first transistor is electrically connected to a first power line, wherein one of the source electrode and the drain electrode of the second transistor is electrically connected to a second power line, wherein one of the pair of gate electrodes of the first transistor is electrically connected to a third power line, wherein the other of the pair of gate electrodes of the first transistor is electrically connected to a fourth power line, wherein one of the pair of gate electrodes of the second transistor is electrically connected to a fifth power line, wherein the other of the source electrode and the drain electrode of the first transistor is electrically connected to the other of the source electrode and the drain electrode of the second transistor and an output terminal, wherein the other of the pair of gate electrodes of the second transistor is electrically connected to an input terminal, wherein a potential of the first power line is higher than a potential of the second power line, wherein a potential of each of the third power line and the fourth power line is the same as or higher than the potential of the first power line, and wherein a potential of the fifth power line is the same as or lower than the potential of the second power line.

7. The semiconductor device according to claim 6, wherein a ratio of channel width to channel length of the first transistor is lower than a ratio of channel width to channel length of the second transistor.

8. The semiconductor device according to claim 6, wherein the first transistor and the second transistor have the same conductivity type.

9. The semiconductor device according to claim 6, wherein the oxide semiconductor film comprises In, Ga, Zn and oxygen.

10. A ring oscillator comprising the semiconductor device according to claim 6.

11. A semiconductor device comprising:
a first inverter comprising a first transistor and a second transistor; and
a second inverter comprising a third transistor and a fourth transistor,
wherein each of the first transistor, the second transistor, the third transistor and the fourth transistor comprises:
an oxide semiconductor film;
a pair of gate electrodes with the oxide semiconductor film provided therebetween; and
a source electrode and a drain electrode,
wherein one of the source electrode and the drain electrode of the first transistor is electrically connected to a first power line,
wherein one of the source electrode and the drain electrode of the second transistor is electrically connected to a second power line,
wherein one of the pair of gate electrodes of the first transistor is electrically connected to a third power line,
wherein one of the pair of gate electrodes of the second transistor is electrically connected to a fourth power line,
wherein the other of the pair of gate electrodes of the first transistor is electrically connected to an output terminal of the second inverter,
wherein the other of the source electrode and the drain electrode of the first transistor is electrically connected to the other of the source electrode and the drain electrode of the second transistor and an output terminal of the first inverter, and wherein the other of the pair of gate electrodes of the second transistor is electrically connected to an input terminal of the second inverter.

12. The semiconductor device according to claim 11, wherein a ratio of channel width to channel length of the first transistor is lower than a ratio of channel width to channel length of the second transistor.

13. The semiconductor device according to claim 11,
wherein a potential of the first power line is higher than a potential of the second power line,
wherein a potential of the third power line is the same as or higher than the potential of the first power line, and
wherein a potential of the fourth power line is the same as or lower than the potential of the second power line.

14. The semiconductor device according to claim 11, wherein the first transistor, the second transistor, the third transistor, and the fourth transistor have the same conductivity type.

15. The semiconductor device according to claim 11, wherein the oxide semiconductor film comprises In, Ga, Zn and oxygen.

16. The semiconductor device according to claim 11,
wherein one of the source electrode and the drain electrode of the third transistor is electrically connected to a fifth power line,
wherein one of the source electrode and the drain electrode of the fourth transistor is electrically connected to a sixth power line,
wherein one of the pair of gate electrodes of the third transistor is electrically connected to a seventh power line,
wherein one of the pair of gate electrodes of the fourth transistor is electrically connected to an eighth power line,
wherein the other of the pair of gate electrodes of the third transistor is electrically connected to the other of the source electrode and the drain electrode of the third transistor, the other of the source electrode and the drain electrode of the fourth transistor, and the other of the pair of gate electrodes of the first transistor, and
wherein the other of the pair of gate electrodes of the fourth transistor is electrically connected to the input terminal of the first inverter.

17. The semiconductor device according to claim 11,
wherein one of the source electrode and the drain electrode of the third transistor is electrically connected to a fifth power line,
wherein one of the source electrode and the drain electrode of the fourth transistor is electrically connected to a sixth power line,
wherein one of the pair of gate electrodes of the third transistor is electrically connected to a seventh power line,
wherein the other of the pair of gate electrodes of the third transistor is electrically connected to an eighth power line,
wherein one of the pair of gate electrodes of the fourth transistor is electrically connected to a ninth power line,
wherein the other of the source electrode and the drain electrode of the third transistor is electrically connected to the other of the source electrode and the drain electrode of the fourth transistor and the other of the pair of gate electrodes of the first transistor, and
wherein the other of the pair of gate electrodes of the fourth transistor is electrically connected to the input terminal of the first inverter.

18. A ring oscillator comprising the semiconductor device according to claim 11.

* * * * *